(12) United States Patent
Lu et al.

(10) Patent No.: US 11,871,625 B2
(45) Date of Patent: Jan. 9, 2024

(54) DISPLAY SUBSTRATE, PREPARATION METHOD THEREOF, AND DISPLAY APPARATUS

(71) Applicant: BOE Technology Group Co., Ltd., Beijing (CN)

(72) Inventors: Pengcheng Lu, Beijing (CN); Shengji Yang, Beijing (CN); Kuanta Huang, Beijing (CN); Xiaochuan Chen, Beijing (CN); Yage Song, Beijing (CN); Yanming Wang, Beijing (CN); Hui Wang, Beijing (CN); Dongdong Duan, Beijing (CN); Jiantong Li, Beijing (CN); Xiao Bai, Beijing (CN); Yunlong Li, Beijing (CN); Shuai Tian, Beijing (CN); Zhijian Zhu, Beijing (CN); Yu Ao, Beijing (CN); Junbo Wei, Beijing (CN); Chao Pu, Beijing (CN); Yuanlan Tian, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 510 days.

(21) Appl. No.: 17/266,625

(22) PCT Filed: Mar. 27, 2020

(86) PCT No.: PCT/CN2020/081855
§ 371 (c)(1),
(2) Date: Feb. 8, 2021

(87) PCT Pub. No.: WO2021/189483
PCT Pub. Date: Sep. 30, 2021

(65) Prior Publication Data
US 2022/0115484 A1    Apr. 14, 2022

(51) Int. Cl.
*H01L 23/00* (2006.01)
*H10K 59/131* (2023.01)
*H10K 59/12* (2023.01)

(52) U.S. Cl.
CPC ....... *H10K 59/131* (2023.02); *H10K 59/1201* (2023.02)

(58) Field of Classification Search
CPC .................. H10K 59/131; H10K 59/1201
See application file for complete search history.

(56) References Cited

U.S. PATENT DOCUMENTS

| 2013/0056714 A1 | 3/2013 | Hasegawa et al. |
| 2013/0316475 A1 | 11/2013 | Yu et al. |

(Continued)

FOREIGN PATENT DOCUMENTS

| CN | 102969457 A | 3/2013 |
| CN | 103427048 A | 12/2013 |

(Continued)

*Primary Examiner* — Anthony Ho
(74) *Attorney, Agent, or Firm* — Ling Wu; Stephen Yang; Ling and Yang Intellectual Property

(57) ABSTRACT

Provided are a display substrate and a preparation method thereof, and a display apparatus. The display substrate includes a silicon-based substrate and an array structure layer arranged on the silicon-based substrate; a driving transistor and a first power line being arranged in the silicon-based substrate in the display area, a light emitting element being disposed on the array structure layer in the display area, a first electrode of the driving transistor being connected with the first power line, and a second electrode of the driving transistor being connected with an anode of the light emitting element; a power supply electrode and a second power line being arranged in the silicon-based substrate in the peripheral area, the power supply electrode being connected with the second power line.

18 Claims, 9 Drawing Sheets

(56) References Cited

U.S. PATENT DOCUMENTS

| | | |
|---|---|---|
| 2017/0062478 A1 | 3/2017 | Choi |
| 2017/0104008 A1 | 4/2017 | Takenaka |
| 2017/0250199 A1 | 8/2017 | Odaka |
| 2019/0165297 A1 | 5/2019 | Lee et al. |
| 2019/0198589 A1 | 6/2019 | Choi et al. |
| 2019/0311683 A1 | 10/2019 | Park et al. |
| 2021/0074790 A1 | 3/2021 | Wang et al. |
| 2021/0091152 A1 | 3/2021 | Yang et al. |

FOREIGN PATENT DOCUMENTS

| | | |
|---|---|---|
| CN | 107132708 A | 9/2017 |
| CN | 109842977 A | 6/2019 |
| CN | 110010621 A | 7/2019 |
| CN | 110459505 A | 11/2019 |
| CN | 110473895 A | 11/2019 |
| CN | 110610975 A | 12/2019 |
| JP | 2017-72811 A | 4/2017 |

DISPLAY SUBSTRATE, PREPARATION METHOD THEREOF, AND DISPLAY APPARATUS

CROSS-REFERENCE TO RELATED APPLICATIONS

The present application is a U.S. National Phase Entry of International Application No. PCT/CN2020/081855 having an international filing date of Mar. 27, 2020. The above-identified application is incorporated into this application by reference in their entirety.

TECHNICAL FIELD

The present disclosure relates to, but is not limited to, the field of display technology, and particularly relates to a display substrate, a preparation method thereof, and a display apparatus.

BACKGROUND

Micro Organic Light-Emitting Diodes (Micro-OLEDs) are micro-displays that have been developed in recent years, and silicon-based OLEDs are one kind of them. A silicon-based OLED can not only achieve active addressing of pixels, but also allow the preparation of a pixel driving circuit, a timing control (TCON) circuit, an over-current protection (OCP) circuit, etc. on a silicon-based substrate, which is conducive to reducing system volume and achieving light weight. A silicon-based OLED is prepared by a mature Complementary Metal Oxide Semiconductor (CMOS) integrated circuit technology, has the advantages of small volume, high resolution (Pixels Per Inch (PPI)), high refresh rate, etc., and is widely used in the near-eye display field of Virtual Reality (VR) or Augmented Reality (AR).

SUMMARY

The following is a summary of the subject matter described in detail herein. This summary is not intended to limit the protection scope of the claims.

The present disclosure provides a display substrate, including a display area, a peripheral area and a binding area, the peripheral area being located at a periphery of the display area, the binding area being located on one side of the peripheral area away from the display area; the display substrate including a silicon-based substrate and an array structure layer arranged on the silicon-based substrate; a driving transistor and a first power line being arranged in the silicon-based substrate in the display area, a light emitting element being disposed on the array structure layer in the display area, a first electrode of the driving transistor being connected with the first power line, and a second electrode of the driving transistor being connected with an anode of the light emitting element; a power supply electrode and a second power line being arranged in the silicon-based substrate in the peripheral area, the power supply electrode being connected with the second power line; and a bonding pad assembly being disposed in the silicon-based substrate in the binding area, a binding platform being arranged on the array structure layer in the binding area, the binding platform being connected with the bonding pad assembly by a conductive pillar, the bonding pad assembly being connected with the first power line and the second power line, the binding platform and the anode of the light emitting element being arranged on the same layer, and the binding platform being configured to be bound to a flexible printed circuit.

In some possible implementations, the array structure layer in the display area includes a first insulating layer arranged on the silicon-based substrate, a reflective electrode arranged on the first insulating layer and a second insulating layer covering the reflective electrode, the first insulating layer is provided with a first via hole in which a first conductive pillar is arranged, the reflective electrode is connected with the second electrode of the driving transistor by the first conductive pillar, and the second insulating layer is provided with a second via hole in which a second conductive pillar connected with the reflective electrode is arranged.

In some possible implementations, the light emitting element in the display area includes an anode arranged on the second insulating layer, an organic light emitting layer connected with the anode and a cathode connected with the organic light emitting layer, and the anode is connected with the reflective electrode by the second conductive pillar.

In some possible implementations, the array structure layer in the binding area includes a first insulating layer and a second insulating layer stacked on the silicon-based substrate, the first insulating layer and the second insulating layer are provided with third via holes in which third conductive pillars are arranged, and the binding platform is arranged on the second insulating layer and is connected with the bonding pad assembly by the third conductive pillars.

In some possible implementations, the bonding pad assembly includes a plurality of strip-shaped binding electrodes arranged at intervals, the binding platform includes a plurality of overlap electrodes arranged in an array, and a plurality of overlap electrodes are connected with one strip-shaped binding electrode by a plurality of third conductive pillars.

In some possible implementations, the bonding pad assembly includes a plurality of strip-shaped binding electrodes arranged at intervals, the binding platform includes a plurality of strip-shaped overlap electrodes arranged at intervals, and one overlapping electrode is connected with one strip-shaped binding electrode by a plurality of third conductive pillars.

In some possible implementations, materials of the first conductive pillar, the second conductive pillar and the third conductive pillar include tungsten.

In some possible implementations, a second connection electrode and a cathode of the light emitting element are arranged on the array structure layer in the peripheral area, the cathode of the light emitting element is connected with the second connection electrode, and the second connection electrode is connected with the power supply electrode.

In some possible implementations, the array structure layer in the peripheral area includes a first insulating layer arranged on the silicon-based substrate, a first connection electrode arranged on the first insulating layer and a second insulating layer covering the first connection electrode, the first insulating layer is provided with a first via hole in which a first conductive pillar is arranged, the first connection electrode is connected with the power supply electrode by the first conductive pillar, and the second insulating layer is provided with a second via hole in which a second conductive pillar is arranged, and the second connection electrode is connected with the first connection electrode by the second conductive pillar.

The present disclosure further provides a display apparatus, including the aforementioned display substrate.

The present disclosure further provides a method for preparing a display substrate, the display substrate including a display area, a peripheral area and a binding area, the peripheral area being located at a periphery of the display area and the binding area being located on one side of the peripheral area away from the display area; the method including:

forming an array structure layer on a silicon-based substrate; a driving transistor and a first power line being arranged in the silicon-based substrate in the display area, and a first electrode of the driving transistor being connected with the first power line; a power supply electrode and a second power line being arranged in the silicon-based substrate in the peripheral area, and the power supply electrode being connected with the second power line; and a bonding pad assembly being arranged in the silicon-based substrate in the binding area, and the bonding pad assembly being connected with the first power line and the second power line;

forming a light emitting element and a binding platform on the array structure layer; the light emitting element being located in the display area, and an anode of the light emitting element being connected with a second electrode of the driving transistor; the binding platform being located in the binding area, and the binding platform being connected with the bonding pad assembly by a conductive pillar; and the binding platform and the anode of the light emitting element being arranged on the same layer, and the binding platform being configured to be bound to a flexible printed circuit.

In some possible implementations, the forming an array structure layer on a silicon-based substrate includes:

forming a first insulating layer on the silicon-based substrate; the first insulating layer in the display area and the peripheral area being formed with a first via hole;

forming a first conductive pillar in the first via hole;

forming a reflective electrode and a first connection electrode; the reflective electrode in the display area being connected with the second electrode of the driving transistor by the first conductive pillar, and the first connection electrode in the peripheral area being connected with the power supply electrode by the first conductive pillar;

forming a second insulating layer covering the reflective electrode and the first connection electrode; the second insulating layer in the display area and the peripheral area being formed with a second via hole, and the second insulating layer in the binding area being formed with a third via hole;

forming a second conductive pillar and a third conductive pillar in the second via hole and the third via hole, respectively; the second conductive pillar in the display area being connected with the reflective electrode, the second conductive pillar in the peripheral area being connected with the first connection electrode, and the third conductive pillar in the binding area being connected with the bonding pad assembly.

In some possible implementations, the forming a light emitting element and a binding platform on the array structure layer includes:

forming an anode on the second insulating layer in the display area, a second connection electrode on the second insulating layer in the peripheral area, and a binding platform on the second insulating layer in the binding area by one patterning process; the anode being connected with the reflective electrode by the second conductive pillar, the second connection electrode being connected with the first connection electrode by the second conductive pillar, and the binding platform being connected with the bonding pad assembly by the third conductive pillar;

forming a pixel definition layer in the display area and the peripheral area; the pixel definition layer in the display area being provided with a pixel opening exposing the anode, and the pixel definition layer in the peripheral area being provided with a cathode via hole exposing the second connection electrode;

forming an organic light emitting layer in the display area; the organic light emitting layer being connected with the anode through the pixel opening;

forming a cathode in the display area and the peripheral area; the cathode in the display area being connected with the organic light emitting layer, and the cathode in the peripheral area being connected with the second connection electrode through the cathode via hole.

In some possible implementations, the bonding pad assembly includes a plurality of strip-shaped binding electrodes arranged at intervals, the binding platform includes a plurality of overlap electrodes arranged in an array, and a plurality of overlap electrodes are connected with one strip-shaped binding electrode by a plurality of third conductive pillars.

In some possible implementations, the bonding pad assembly includes a plurality of strip-shaped binding electrodes arranged at intervals, the binding platform includes a plurality of strip-shaped overlap electrodes arranged at intervals, and one overlapping electrode is connected with one strip-shaped binding electrode by a plurality of third conductive pillars.

In some possible implementations, materials of the first conductive pillar, the second conductive pillar and the third conductive pillar include tungsten.

Other aspects will become apparent upon reading and understanding the accompanying drawings and the detailed description.

BRIEF DESCRIPTION OF DRAWINGS

Accompanying drawings are used to provide a further understanding of technical solutions of the present disclosure and form a part of the specification. Together with embodiments of the present disclosure, they are used to explain technical solutions of the present disclosure and do not constitute a limitation on the technical solutions of the present disclosure. The shapes and dimensions of the components in the drawings do not reflect real proportions, and are only for the purpose of schematically illustrating the contents of the present disclosure.

DESCRIPTION OF REFERENCE SIGNS

Figure 1:
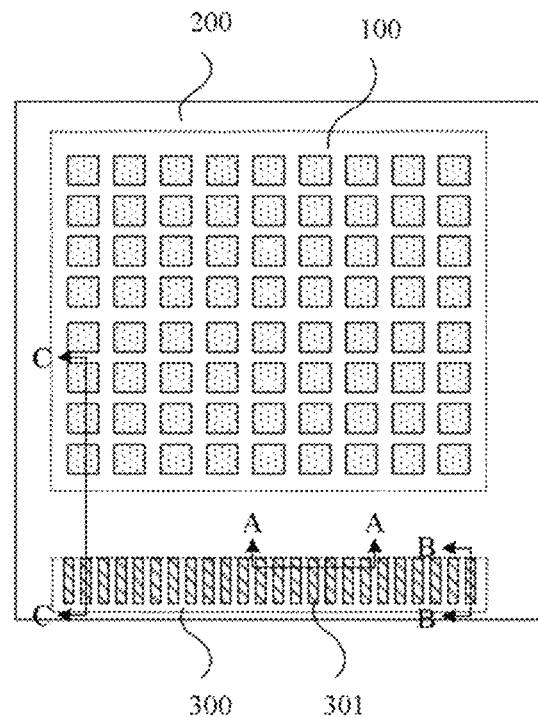
FIG. 1 is a schematic plan view of a display substrate.

10—silicon-based substrate; 11—driving transistor; 12—first insulating layer; 13—first conductive pillar; 14—reflective electrode; 15—second insulating layer; 16—second conductive pillar; 20—array structure layer; 30—light emitting element; 31—anode; 32—pixel definition layer; 33—organic light emitting layer; 34—cathode; 35—encapsulation layer; 40—color filter layer; 50—cover plate; 100—display area; 101—pixel driving circuit; 102—light emitting device; 110—voltage control circuit; 200—peripheral area; 300—binding area; 301—bonding pad assembly; 302—binding electrode; 303—third conductive pillar; 304—binding platform; 310—insulating layer; 320—groove; 400—flexible printed circuit; 401—gold finger; 500—anisotropic conductive film; and 501—conductive gold ball.

DETAILED DESCRIPTION

To make the objects, technical solutions and advantages of the present disclosure more clear, embodiments of the present disclosure will be described in detail below with reference to the accompanying drawings. The embodiments may be implemented in a number of different forms. A person of ordinary skills in the art may readily understand the fact that implementations and contents may be transformed into a variety of forms without departing from the spirit and scope of the present disclosure. Therefore, the present disclosure should not be construed as being limited only to what is described in the following embodiments. Without conflict, embodiments in the present disclosure and features in the embodiments may be combined with each other arbitrarily.

In the drawings, the size of each constituent element, or the thickness or area of a layer, is sometimes exaggerated for clarity. Therefore, an embodiment of the present disclosure is not necessarily limited to the size shown, and the shapes and dimensions of the components in the drawings do not reflect real proportions. In addition, the drawings schematically show ideal examples, and an embodiment of the present disclosure is not limited to the shapes or values shown in the drawings.

The ordinal numbers such as "first", "second" and "third" in this specification are used to avoid confusion of constituent elements, rather than to limit in terms of quantity.

In this specification, for convenience, words and expressions indicating orientation or positional relationship, such as "middle", "upper", "lower", "front", "rear", "vertical", "horizontal", "top", "bottom", "inner", "outer" and the like, are used to describe the positional relationship of the constituent elements with reference to the accompanying drawings, which are only for the convenience of describing this specification and simplifying the description, rather than indicating or implying that the apparatus or element referred to must have the specific orientation, or be constructed and operated in the specific orientation, and thus cannot be interpreted as a limitation on the present disclosure. The positional relationship of the constituent elements is appropriately changed according to the direction in which each constituent element is described. Therefore, it is not limited to the words and expressions used in the specification, and can be changed appropriately according to the situation.

In this specification, unless otherwise clearly specified or defined, the terms "install", "connect" and "link" should be broadly interpreted, for example, it may be fixed connection, detachable connection, or integral connection; it may be a mechanical connection or an electrical connection; and it may be direct connection, indirect connection through an intermediary, or an internal connection between two elements. Those of ordinary skills in the art can understand the specific meanings of the above terms in the present disclosure according to specific situations.

In this specification, a transistor refers to an element including at least three terminals, namely a gate electrode, a drain electrode and a source electrode. The transistor has a channel region between the drain electrode (a drain electrode terminal, a drain region or a drain electrode) and the source electrode (a source electrode terminal, a source region or a source electrode), and current can flow through the drain electrode, the channel region and the source electrode. In this specification, the channel region refers to a region through which current mainly flows.

In this specification, it may be the case that the first electrode is a drain electrode and the second electrode is a source electrode, and it may also be the case that the first electrode is a source electrode and the second electrode is a drain electrode. In a case where transistors with opposite polarities are used or the direction of current changes during circuit operation, the functions of "source electrode" and "drain electrode" are sometimes interchanged. Therefore, in this specification, "source electrode" and "drain electrode" may be interchanged.

In this specification, "connection" includes a case where the constituent elements are connected together by an element having a certain electrical function. The "element having a certain electrical function" is not particularly limited as long as it can transmit and receive electrical signals between connected constituent elements. Examples of the "element having a certain electrical function" not only include electrodes and wirings, but also include switching elements such as transistors, resistors, inductors, capacitors, and other elements with various functions.

In this specification, "parallel" refers to a state in which an angle formed by two straight lines is −10 degrees or more and 10 degrees or less, and thus also includes a state in which the angle is −5 degrees or more and 5 degrees or less. In addition, "vertical" refers to a state in which an angle formed by two straight lines is 80 degrees or more and 100 degrees or less, and thus also includes a state of an angle being 85 degrees or more and 95 degrees or less.

In this specification, "film" and "layer" can be interchanged. For example, "conductive layer" can sometimes be replaced by "conductive film". Similarly, "insulating film" can sometimes be replaced by "insulating layer".

FIG. 1 is a schematic plan view of a display substrate. As shown in FIG. 1, a silicon-based OLED display substrate includes a display area (AA area) 100, a peripheral area 200 located at the periphery of the display area 100, and a binding area 300 located on one side of the peripheral area 200 away from the display area 100. A plurality of display units arranged regularly are provided in the display area 100, a control circuit for driving the display units to emit light is disposed in the peripheral area 200, and a bonding pad assembly 301 for binding to an external Flexible Printed Circuit (FPC) is disposed in the binding area 300. A method for preparing a display substrate includes: preparing a plurality of display substrates on a display motherboard, the display substrate including an encapsulation layer covering a display area 100, a peripheral area 200 and a binding area 300, that is, the encapsulation layer covers the entire surface; then, removing the encapsulation layer from the binding area 300 by an opening process, to expose the bonding pad assembly 301 in the binding area 300; and next, cutting the display motherboard into a plurality of separate display substrates, followed by bonding a flexible printed circuit to the bonding pad assembly 301 by an Anisotropic Conductive Film (ACF).

Figure 2:
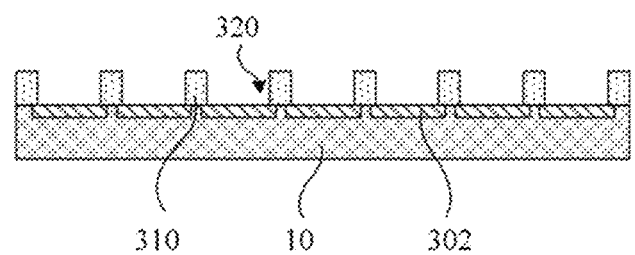
FIGS. 2 and 3 are schematic sectional views of a display substrate after an opening process.
Figure 3:
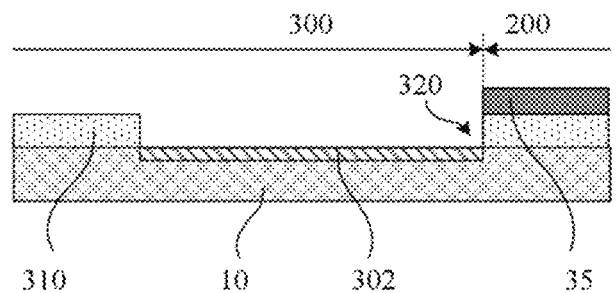

FIGS. 2 and 3 are schematic sectional views of a display substrate after an opening process. FIG. 2 is a sectional view in an A-A direction in FIG. 1, and FIG. 3 is a sectional view in a B-B direction in FIG. 1. As shown in FIGS. 2 and 3, the bonding pad assembly 301 includes a plurality of binding electrodes 302 arranged at intervals, and the strip-shaped binding electrodes 302 extend in a direction away from the display area 100. In a plane perpendicular to the display substrate, the encapsulation layer 35 in the binding area 300 is removed by an opening process, therefore the binding area 300 includes a silicon-based substrate 10 with the bonding pad assembly 301 and an insulating layer 310 arranged on the silicon-based substrate 10. The insulating layer 310 is provided with a plurality of grooves 320 arranged at intervals. The grooves 320 extend in the direction away from the display area 100. Each groove 320 exposes a binding electrode 302. The peripheral area 200 includes an insulating layer 310 and the encapsulation layer 35 stacked on the silicon-based substrate 10. Since the insulating layer 310 in the binding area 300 is provided with a plurality of grooves 320, the film layer structure of the binding area 300 is a zigzag structure.

Figure 4:
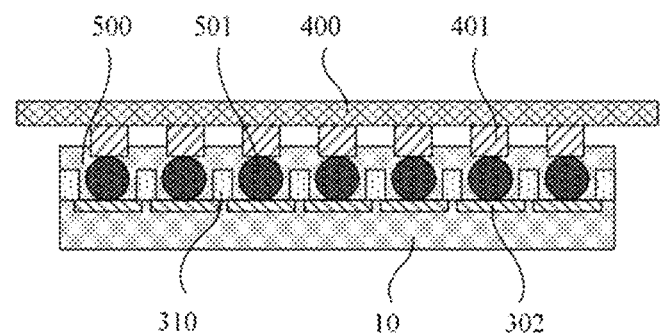
FIGS. 4 and 5 are schematic sectional views of a display substrate in a binding process.
Figure 5:
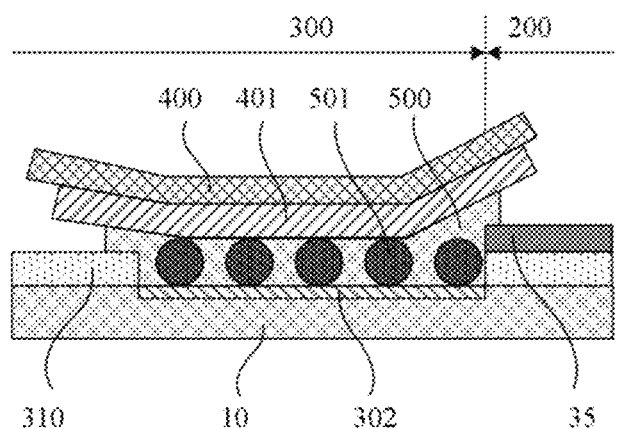

FIGS. 4 and 5 are schematic sectional views of a display substrate in a binding process. FIG. 4 is a sectional view in an A-A direction in FIG. 1, and FIG. 5 is a sectional view in a B-B direction in FIG. 1. As shown in FIGS. 4 and 5, in the binding process of binding a flexible printed circuit to the bonding pad assembly by an anisotropic conductive film, it is required that conductive gold balls (Au balls) 501 in the anisotropic conductive film 500 respectively contact the gold fingers 401 of the flexible printed circuit 400 and the binding electrodes 302 of the bonding pad assembly, and the conductive gold balls 501 are crushed by pressing to achieve electrical connection between the gold fingers 401 and the binding electrodes 302. As shown in FIG. 4, on a section in the A-A direction, the gold fingers 401 and the conductive gold balls 501 are press fit well, and the gold fingers 401 can crush the conductive gold balls 501. As shown in FIG. 5, in a section in the B-B direction, since the peripheral area 200 includes the encapsulation layer 35, while the binding area 300 does not have the encapsulation layer 35, there is a height difference between the film layer of the binding area 300 and the film layer of the peripheral area 200. Due to the height difference, the conductive gold balls 501 at the junction between the binding area 300 and the peripheral area 200 are not well press between the gold fingers 401 and the binding electrodes 302, and as a result, the gold fingers 401 cannot crush the conductive gold balls 501, which affects reliability of electrical connection between the gold fingers 401 and the binding electrodes 302. In addition, the gold fingers 401 of the flexible printed circuit 400 cannot press the conductive gold balls 501 well, which reduces the adhesive force between the flexible printed circuit 400 and the display substrate, and may cause the flexible printed circuit 400 to fall off during use, thereby increasing the risk of product failure.

The present disclosure provides a display substrate, including a display area, a peripheral area and a binding area, the peripheral area being located at a periphery of the display area, the binding area being located on one side of the peripheral area away from the display area; the display substrate including a silicon-based substrate and an array structure layer arranged on the silicon-based substrate; a driving transistor and a first power line being arranged in the silicon-based substrate in the display area, a light emitting element being disposed on the array structure layer in the display area, a first electrode of the driving transistor being connected with the first power line, and a second electrode of the driving transistor being connected with an anode of the light emitting element; a power supply electrode and a second power line being arranged in the silicon-based substrate in the peripheral area, the power supply electrode being connected with the second power line; and a bonding pad assembly being disposed in the silicon-based substrate in the binding area, a binding platform being arranged on the array structure layer in the binding area, the binding platform being connected with the bonding pad assembly by a conductive pillar, the bonding pad assembly being connected with the first power line and the second power line, the binding platform and the anode of the light emitting element being arranged on the same layer, and the binding platform being configured to be bound to a flexible printed circuit.

In some possible implementations, the array structure layer in the display area includes a first insulating layer arranged on the silicon-based substrate, a reflective electrode arranged on the first insulating layer and a second insulating layer covering the reflective electrode, the first insulating layer is provided with a first via hole in which a first conductive pillar is arranged, the reflective electrode is connected with the second electrode of the driving transistor by the first conductive pillar, and the second insulating layer is provided with a second via hole in which a second conductive pillar connected with the reflective electrode is arranged.

In some possible implementations, the light emitting element in the display area includes an anode arranged on the second insulating layer, an organic light emitting layer connected with the anode and a cathode connected with the organic light emitting layer, and the anode is connected with the reflective electrode by the second conductive pillar.

In some possible implementations, the array structure layer in the binding area includes a first insulating layer and a second insulating layer stacked on the silicon-based substrate, the first insulating layer and the second insulating layer are provided with third via holes in which third conductive pillars are arranged, and the binding platform is arranged on the second insulating layer and is connected with the bonding pad assembly by the third conductive pillars.

In some possible implementations, the bonding pad assembly includes a plurality of strip-shaped binding electrodes arranged at intervals, the binding platform includes a plurality of overlap electrodes arranged in an array, and a plurality of overlap electrodes are connected with one strip-shaped binding electrode by a plurality of third conductive pillars. Alternatively, the bonding pad assembly includes a plurality of strip-shaped binding electrodes arranged at intervals, the binding platform includes a plurality of strip-shaped overlap electrodes arranged at intervals, and one overlapping electrode is connected with one strip-shaped binding electrode by a plurality of third conductive pillars.

In some possible implementations, materials of the first conductive pillar, the second conductive pillar and the third conductive pillar include tungsten.

In some possible implementations, a second connection electrode and a cathode of the light emitting element are arranged on the array structure layer in the peripheral area, the cathode of the light emitting element is connected with the second connection electrode, and the second connection electrode is connected with the power supply electrode.

In some possible implementations, the array structure layer in the peripheral area includes a first insulating layer arranged on the silicon-based substrate, a first connection electrode arranged on the first insulating layer and a second insulating layer covering the first connection electrode, the first insulating layer is provided with a first via hole in which a first conductive pillar is arranged, the first connection electrode is connected with the power supply electrode by the first conductive pillar, and the second insulating layer is provided with a second via hole in which a second conductive pillar is arranged, and the second connection electrode is connected with the first connection electrode by the second conductive pillar.

Figure 6:
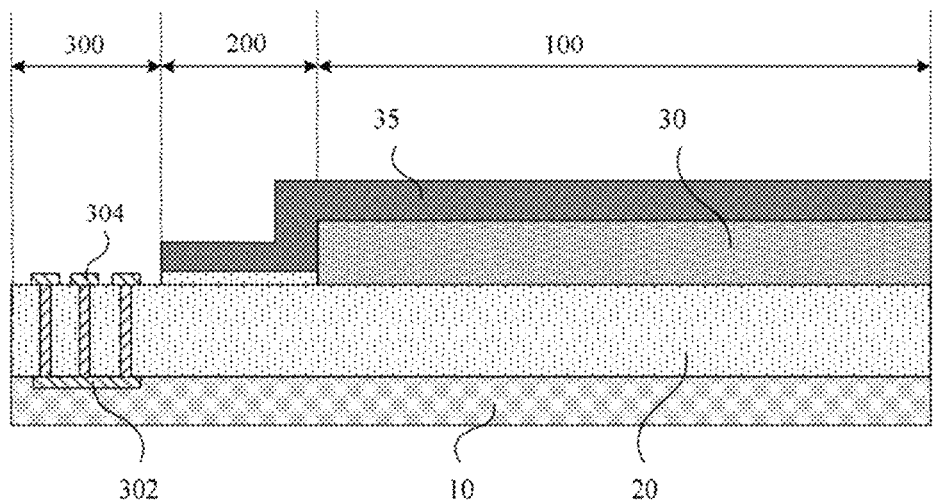
FIG. 6 is a schematic diagram of a structure of a display substrate according to the present disclosure.

FIG. 6 is a schematic diagram of a structure of a display substrate according to the present disclosure. As shown in FIG. 6, the display substrate includes a display area 100, a peripheral area 200 located at the periphery of the display area 100, and a binding area 300 located on one side of the peripheral area 200 away from the display area 100. A plurality of display units arranged regularly are provided in the display area 100, a cathode ring is disposed in the peripheral area 200, and a binding platform is disposed in the binding area 300. In a plane perpendicular to the display substrate, the display area 100, the peripheral area 200 and the binding area 300 of the display substrate all include a silicon-based substrate 10 and an array structure layer 20 disposed on the silicon-based substrate 10. The array structure layer 20 in the display area 100 is provided with a light emitting element 30 and the encapsulation layer 35. The array structure layer 20 in the peripheral area 200 is provided with the cathode ring and the encapsulation layer 35. The array structure layer 20 in the binding area 300 is provided with a binding platform 304 which is connected with a binding electrode 302 of the silicon-based substrate 10 by a conductive pillar. The binding platform 304 in the binding area 300 and the anode of the light emitting element 30 in the display area 100 are arranged on the same layer, and formed by a same patterning process. The binding platform 304 is configured to be bound to an external flexible printed circuit.

The silicon-based substrate 10 is also called an IC wafer, on which a pixel driving circuit for generating a driving signal, a gate driving circuit for generating a gate driving signal and a data driving circuit for generating a data signal are integrated. The light emitting element 30 includes an anode, an organic light emitting layer and a cathode stacked on the array structure layer 20. In the present disclosure, by disposing the binding platform 304, which serves as an substrate for binding to a flexible printed circuit (FPC), on the array structure layer 20 in the binding area 300, the height difference between the film layer of the binding area 300 and the film layer of the peripheral area 200 is reduced, so that the gold fingers of the flexible printed circuit can well press the conductive gold balls in the anisotropic conductive film in the binding process, which not only can ensure that the gold fingers crush the conductive gold balls to achieve reliable electrical connection between the gold fingers and the binding platform, but also can make the adhesive force between the flexible printed circuit and the display substrate more stable through more thorough press, thereby improving the working reliability of the flexible printed circuit.

Figure 7:
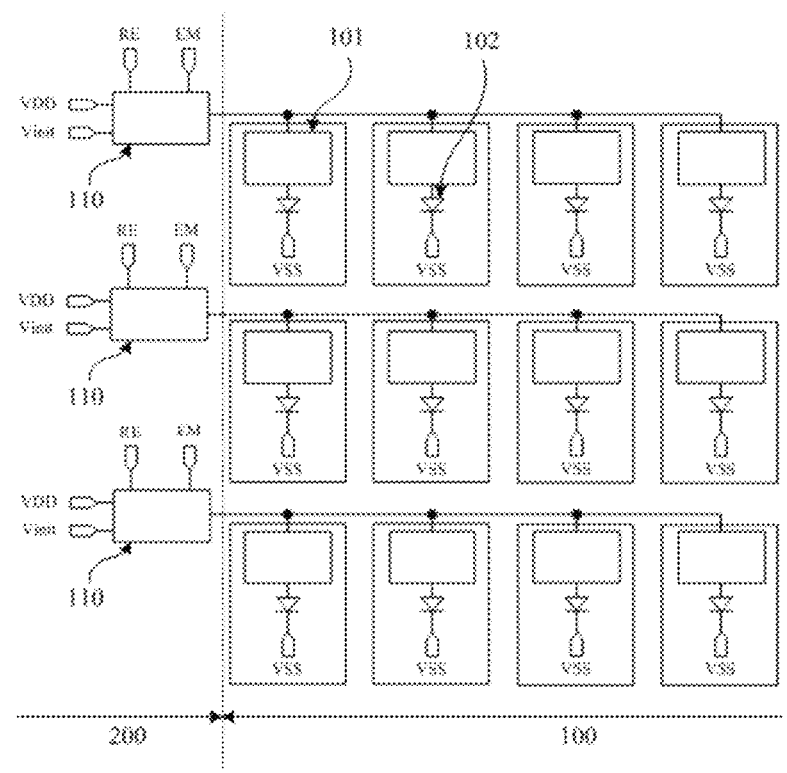
FIG. 7 is a schematic diagram of a circuit principle of a silicon-based substrate according to the present disclosure.

FIG. 7 is a schematic diagram of a circuit principle of a silicon-based substrate according to the present disclosure. As shown in FIG. 7, the silicon-based substrate 10 includes a plurality of display units in the display area 100 and a control circuit in the peripheral area 200. The plurality of display units in the display area 100 are regularly arranged to form a plurality of display rows and a plurality of display columns. Each display unit includes a pixel driving circuit 101 and a light emitting device 102 connected to the pixel driving circuit 101. The pixel driving circuit 101 includes at least a driving transistor. The control circuit includes at least a plurality of voltage control circuits 110 each connected with driving transistors of a plurality of pixel driving circuits 101. For example, one voltage control circuit 110 is connected to the pixel driving circuits 101 in one display row, first electrodes of the driving transistors in pixel driving circuits 101 in this display row are collectively connected to this voltage control circuit 110, a second electrode of each driving transistor is connected to an anode of the light emitting device 102 of the display unit in which the driving transistor is located, and a cathode of the light emitting device 102 is connected to an input end of a second power source signal VSS. The voltage control circuits 110 are respectively connected to an input end of a first power source signal VDD, an input end of an initialization signal Vinit, an input end of a reset control signal RE and an input end of a light emitting control signal EM. The voltage control circuit 110 is configured to output, in response to a reset control signal RE, an initialization signal Vinit to a first electrode of a driving transistor to control a corresponding light emitting device 102 to reset. The voltage control circuit 110 is further configured to output, in response to a light emitting control signal EM, a first power source signal VDD to a first electrode of a driving transistor to drive a light emitting device 102 to emit light. By collectively connecting the pixel driving circuits 101 in one display row to the voltage control circuit 110, the structure of the pixel driving circuits 101 in the display area 100 can be simplified, and the occupied area of the pixel driving circuits 101 in the display area 100 can be reduced, so that more pixel driving circuits 101 and light emitting devices 102 can be arranged in the display area 100, thereby achieving high PPI display. Under the control of the reset control signal RE, the voltage control circuit 110 outputs an initialization signal Vinit to the first electrode of the driving transistor and controls the corresponding light emitting device 102 to reset, which can prevent the voltage applied to the light emitting device 102 during light emission of a frame from affecting light emission of a next frame, and can improve image retention.

In an exemplary embodiment, three display units of different colors constitute one pixel. The three display units may be a red display unit, a green display unit and a blue display unit, respectively. In some possible implementations, one pixel may include four, five or more display units, which can be designed and determined according to the actual application environment, and is not limited here. In some possible implementations, one voltage control circuit 110 may be connected to the pixel driving circuits 101 in two adjacent display units in the same display row, or may be connected to the pixel driving circuits 101 in three or more display units in the same display row, which is not limited here.

Figure 8:
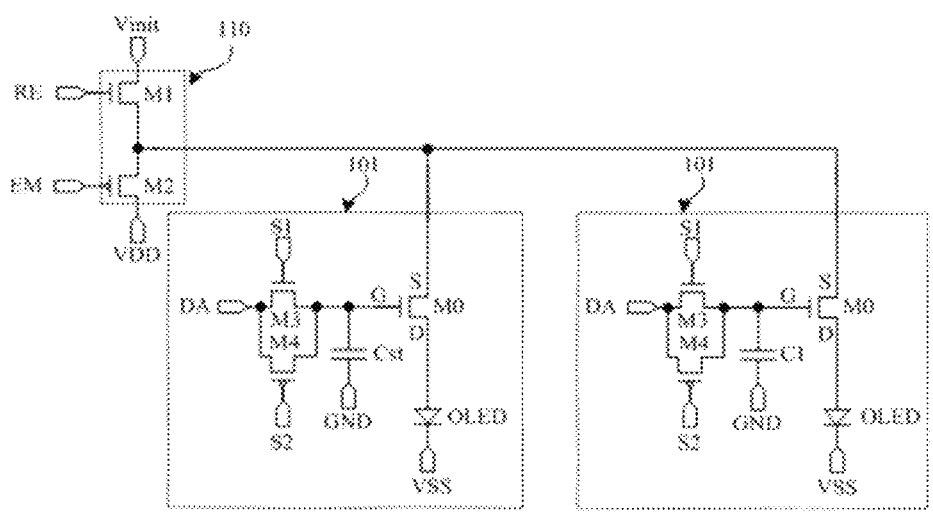
FIG. 8 is a schematic diagram of an implementation circuit of a voltage control circuit and a pixel driving circuit according to the present disclosure.

FIG. 8 is a schematic diagram of an implementation circuit of a voltage control circuit and a pixel driving circuit according to the present disclosure. As shown in FIG. 8, the light emitting device may include an OLED. An anode of the OLED is connected with a second electrode D of a driving transistor M0, and a cathode of the OLED is connected with an input end of a second power source signal VSS. The voltage of the second power source signal VSS generally may be a negative voltage or a ground voltage $V_{GND}$ (generally 0V). The voltage of the initialization signal Vinit may also be a ground voltage $V_{GND}$. In an exemplary embodiment, the OLED may be a Micro-OLED or a Mini-OLED, which is beneficial to the achievement of high PPI display.

In an exemplary embodiment, the voltage control circuit 110 is connected with two pixel driving circuits 101 in one display row. The pixel driving circuit 101 includes a driving transistor M0, a third transistor M3, a fourth transistor M4 and a storage capacitor Cst, and the voltage control circuit 110 includes a first transistor M1 and a second transistor M2. The driving transistor M0, the first transistor M1, the second transistor M2, the third transistor M3 and the fourth transistor M4 are all Metal Oxide Semiconductor (MOS) field-effect transistors prepared in a silicon-based substrate.

A control electrode of the first transistor M1 is connected to the input end of the reset control signal RE and is configured to receive a reset control signal RE, a first electrode of the first transistor M1 is connected to the input end of the initialization signal Vinit and is configured to receive an initialization signal Vinit, and a second electrode of the first transistor M1 is connected to a first electrode S of the corresponding driving transistor M0 and a second electrode of the second transistor M2. A control electrode of the second transistor M2 is connected to the input end of the light emitting control signal EM and is configured to receive a light emitting control signal EM, a first electrode of the second transistor M2 is connected to the input end of the first power source signal VDD and is configured to receive a first power source signal VDD, and the second electrode of the second transistor M2 is connected to the first electrode S of the corresponding driving transistor M0 and the second electrode of the first transistor M1. In an exemplary embodiment, the types of the first transistor M1 and the second transistor M2 may be different, for example, the first transistor M1 is an N-type transistor and the second transistor M2 is a P-type transistor, or the first transistor M1 is a P-type transistor and the second transistor M2 is an N-type transistor. In some possible implementations, the types of the first transistor M1 and the second transistor M2 may be the same, which can be designed and determined according to the actual application environment, and is not limited here.

The pixel driving circuit 101 includes a driving transistor M0, a third transistor M3, a fourth transistor M4 and a storage capacitor Cst. The control electrode G of the driving transistor M0 and the first electrode S of the driving transistor M0 are connected to the second electrode of the first transistor M1 and the second electrode of the second transistor M2, and the second electrode D of the driving transistor M0 is connected to the anode of the OLED. The control electrode of the third transistor M3 is connected to an input end of a first scanning signal S1 and is configured to receive a first scanning signal S1, the first electrode of the third transistor M3 is connected to an input end of a data signal DA and is configured to receive a data signal DA, and the second electrode of the third transistor M3 is connected to the control electrode G of the driving transistor M0. The control electrode of the fourth transistor M4 is connected to an input end of a second scanning signal S2 and is configured to receive a second scanning signal S2, the first electrode of the fourth transistor M4 is connected to the input end of the data signal DA and is configured to receive a data signal DA, and the second electrode of the fourth transistor M4 is connected to the control electrode G of the driving transistor M0. A first end of the storage capacitor Cst is connected to the control electrode G of the driving transistor M0, and a second end of the storage capacitor Cst is connected to the ground end GND. In an exemplary embodiment, the driving transistor M0 may be an N-type transistor, and the types of the third transistor M3 and the fourth transistor M4 may be different, for example, the third transistor M3 is an N-type transistor and the fourth transistor M4 is a P-type transistor. When the voltage of the data signal DA is a voltage corresponding to a high gray scale, the P-type fourth transistor M4 is turned on to transmit the data signal DA to the control electrode G of the driving transistor M0, which can prevent the voltage of the data signal DA from being affected by, for example, a threshold voltage of the N-type third transistor M3. When the voltage of the data signal DA is a voltage corresponding to a low gray scale, the N-type third transistor M3 is turned on to transmit the data signal DA to the control electrode G of the driving transistor M0, which can prevent the voltage of the data signal DA from being affected by a threshold voltage of the P-type fourth transistor M4. In this way, it is possible to increase a range of the voltage input to the control electrode G of the driving transistor M0. In some possible implementations, the types of the third transistor M3 and the fourth transistor M4 may be that: the third transistor M3 is a P-type transistor and the fourth transistor M4 is an N-type transistor. In some possible implementations, the pixel driving circuit may be a 2T1C, 3T1C, 5T1C or 7T1C circuit structure, or may be a circuit structure with an internal compensation or external compensation function, which is not limited in the present disclosure.

Figure 9:
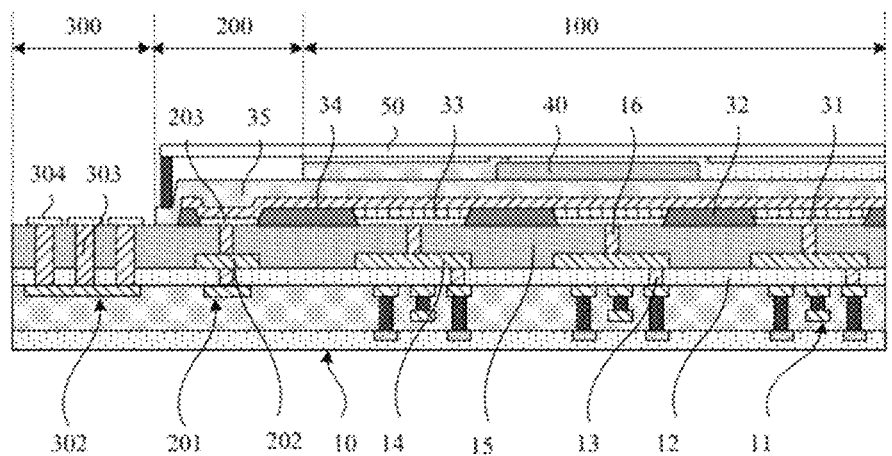
FIG. 9 is a schematic diagram of a structure of a display substrate according to the present disclosure.

FIG. 9 is a schematic diagram of a structure of a display substrate according to the present disclosure, which is a sectional view taken in a C-C direction in FIG. 1. The display substrate includes a display area 100, a peripheral area 200 and a binding area 300. As shown in FIG. 9, in the display area 100, the peripheral area 200 and the binding area 300, the display substrate includes a silicon-based substrate 10 and an array structure layer 20 arranged on the silicon-based substrate 10. The structures of the silicon-based substrate 10 and the array structure layer 20 in the display area 100, the structures of the silicon-based substrate 10 and the array structure layer 20 in the peripheral area 200, and the structures of the silicon-based substrate 10 and the array structure layer 20 in the binding area 300 are different.

In the display area 100, the display substrate further includes a light emitting element disposed on the array structure layer 20, an encapsulation layer 35 disposed on the light emitting element, and a color filter layer 40 disposed on the encapsulation layer 35. A pixel driving circuit is disposed in the silicon-based substrate 10 in the display area 100. The pixel driving circuit may be a 2T1C, 3T1C, 5T1C or 7T1C circuit structure, or may be a circuit structure with an internal compensation or external compensation function. The pixel driving circuit includes at least a first scanning line, a first power line, a data line, a switching transistor and a driving transistor. The first scanning line is used for transmitting a first scanning signal, the first power line is used for transmitting a first power source signal, and the data line is used for transmitting a data signal. The array structure layer in the display area 100 includes a first insulating layer 12 disposed on the silicon-based substrate 10, a reflective electrode 14 disposed on the first insulating layer 12, and a second insulating layer 15 covering the reflective electrode 14. The first insulating layer 12 is provided with a first via hole in which a first conductive pillar 13 is disposed, and the reflective electrode 14 is connected with the second electrode of the driving transistor 11 through the first conductive pillar 13. The second insulating layer is provided with a second via hole in which a second conductive pillar 16 is disposed. The light emitting element in the display area 100 includes an anode 31, a pixel definition layer 32, an organic light emitting layer 33 and a cathode 34. The encapsulation layer 35 covers the cathode 34. The anode 31 is disposed on the second insulating layer 15 and is connected with the reflective electrode 14 through the second conductive pillar 16.

In the peripheral area 200, the display substrate further includes a second connection electrode 203, a cathode 34 and an encapsulation layer 35 disposed on the array structure layer. A second power line and a power supply electrode 201 are arranged in the silicon-based substrate 10 in the peripheral area 200. The second power line is connected with the power supply electrode 201 and is used for transmitting a second power source signal. The array structure layer in the peripheral area 200 includes a first insulating layer 12 disposed on the silicon-based substrate 10, a first connection electrode 202 disposed on the first insulating layer 12, and a second insulating layer 15 covering the first connection electrode 202. The first insulating layer 12 is provided with a first via hole in which a first conductive pillar 13 is disposed, and the first connection electrode 202 is connected with the power supply electrode 201 through the first conductive pillar 13. The second insulating layer 15 is provided with a second via hole in which a second conductive pillar 16 is disposed. The second connection electrode 203 is disposed on the second insulating layer 15 and is connected to the first connection electrode 202 through the second conductive pillar 16. The cathode 34 is disposed on and connected to the second connection electrode 203, and the encapsulation layer 35 covers the cathode 34.

In the binding area 300, the display substrate further includes a binding platform 304 disposed on the array structure layer. A plurality of binding electrodes 302 are arranged in the silicon-based substrate 10 in the binding area 300. The plurality of binding electrodes 302 are respectively connected with the first power line in the display area and the second power line in the peripheral area. The array structure layer in the binding area 300 includes a first insulating layer 12 disposed on the silicon-based substrate 10 and a second insulating layer 15 disposed on the first insulating layer 12. The first insulating layer 12 and the second insulating layer 15 are provided with a plurality of third via holes in which third conductive pillars 303 are disposed. The binding platform 304 is disposed on the second insulating layer 15 and is connected with the binding electrode 302 through the plurality of third conductive pillars 303.

The display substrate of the present disclosure achieves full-color display by white light+color filters. The display substrate further includes a Color Filter (CF) layer 40. The color filter layer located in the display area 100 is arranged on the encapsulation layer 35, and includes a first color unit, a second color unit and a third color unit corresponding to the display units. In the present disclosure, a high resolution of more than 2000 can be achieved by employing the mode of white light+color filters, which can meet the requirement of VR/AR.

The display substrate of the present disclosure further includes a cover plate 50. The cover plate 50 is disposed above the color filter layer 40 and fixed by a sealant, and serves the function of protecting the color filter layer 40. The cover plate 50 can provide further protection against water and oxygen intrusion, thus greatly prolonging the service life of the silicon-based OLED display substrate.

The structure of a display substrate is described below by an example of a preparation process of the display substrate. The "patterning process" mentioned in the present disclosure includes the treatments, such as film layer deposition, photoresist coating, mask exposure, development, etching, and photoresist stripping. Deposition may be implemented by any one or more of sputtering, evaporation and chemical vapor deposition, coating may be implemented by any one or more of spraying and spin coating, and etching may be implemented by any one or more of dry etching and wet etching. "Thin film" refers to a layer of thin film fabricated by a certain material on a base substrate by using a deposition or coating process. If the "thin film" does not require a patterning process during the whole fabrication process, the "thin film" can also be called a "layer". If the "thin film" requires a patterning process throughout the whole fabrication process, it is referred to as a "thin film" before the patterning process and as a "layer" after the patterning process. The "layer" after the patterning process contains at least one "pattern". In the present disclosure, "A and B being arranged on a same layer" means that A and B are formed at the same time by the same patterning process. In the present disclosure, "an orthographic projection of A including an orthographic projection of B" means that the orthographic projection of B falls within the range of the orthographic projection of A, or the orthographic projection of A covers the orthographic projection of B.

Figure 10:
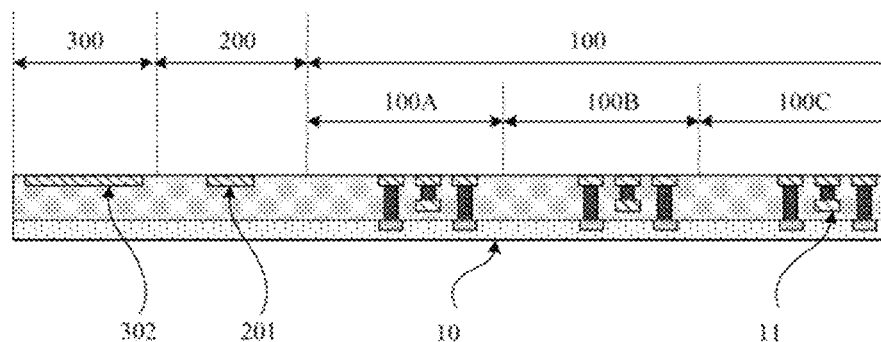
FIG. 10 is a schematic diagram of a display substrate after a silicon-based substrate is formed according to the present disclosure.

(1) A silicon-based substrate 10 is prepared. The silicon-based substrate 10 includes a display area 100, a peripheral area 200 and a binding area 300. The display area 100 includes a plurality of display units. A pixel driving circuit is integrated in the silicon-based substrate 10 of each display unit. The pixel driving circuit may be a 2T1C, 3T1C, 5T1C or 7T1C circuit structure, or may be a circuit structure with an internal compensation or external compensation function. The pixel driving circuit includes at least a first scanning line for transmitting a first scanning signal, a first power line for transmitting a first power source signal, a data line for transmitting a data signal, a switching transistor and a driving transistor. The peripheral area 200 is arranged around the display area 100. A second power line for transmitting a second power source signal and a power supply assembly are integrated in the silicon-based substrate 10 in the peripheral area 200. The second power source line is connected with the power supply assembly. The binding area 300 is arranged on one side of the peripheral area 200 away from the display area 100. A bonding pad assembly is integrated in the silicon-based substrate 10 in the binding area 300. The bonding pad assembly is connected with the first power line in the display area 100 and the second power line in the peripheral area 200. As shown in FIG. 10, as an exemplary illustration, the display area 100 is represented by a first display unit 100A, a second display unit 100B and a third display unit 100C, the pixel driving circuit of the silicon-based substrate 10 in each display unit is represented by a driving transistor 11, the power supply assembly of the silicon-based substrate 10 in the peripheral area 200 is represented by a power supply electrode 201, and the bonding pad assembly of the silicon-based substrate 10 in the binding area 300 is represented by a binding electrode 302. In an exemplary embodiment, the silicon-based substrate 10 includes a silicon base substrate and a circuit layer disposed on the silicon base substrate. In the display area 100, the silicon base substrate includes a source connection region and a drain connection region of a switching transistor, and a source connection region and a drain connection region of a driving transistor. The circuit layer includes a first oxide insulating layer covering the source connection regions and the drain connection regions, a gate metal layer disposed on the first oxide insulating layer, a second oxide insulating layer covering the gate metal layer, and a source-drain metal layer disposed on the second oxide insulating layer. The gate metal layer includes at least a first scanning line, a gate electrode of the switching transistor and a gate electrode of the driving transistor. The source-drain metal layer includes at least a first power line, a data line, source and drain electrodes of the switching transistor, and source and drain electrodes of the driving transistor. The source and drain electrodes are respectively connected with the source and drain connection regions of the corresponding transistors through conductive pillars, thereby forming conductive channels between the source and drain connection regions. The first power line is connected with the source electrode of the driving transistor, the data line is connected with the source electrode of the switching transistor, the first scanning line is connected with the gate electrode of the switching transistor, and the drain electrode of the switching transistor is connected with the gate electrode of the driving transistor through a conductive pillar. The switching transistor is configured to receive, under the control of a first scanning signal output by the first scanning line, a data signal transmitted by the data line, to cause the gate electrode of the driving transistor to receive the data signal. The driving transistor is configured to generate, under the control of a data signal received by the gate electrode thereof, corresponding current in the drain electrode to drive the light emitting element to emit light with corresponding brightness. In the peripheral area 200, the circuit layer includes a first oxide insulating layer and a second oxide insulating layer disposed on the silicon base substrate, and a power supply electrode 201 and a second power line disposed on the second oxide insulating layer. The power supply electrode 201 is connected with the second power line. In the binding area 300, the circuit layer includes a first oxide insulating layer and a second oxide insulating layer disposed on the silicon base substrate, and a binding electrode 302 disposed on the second oxide insulating layer. The binding electrode 302 is connected with the first power line and second power line. The silicon-based substrate 10 may be prepared by mature CMOS integrated circuit technology, which is not limited in the present disclosure. After the silicon-based substrate 10 is prepared, the drain electrode of the driving transistor 11 in the display area 100, the power supply electrode 201 in the peripheral area 200 and the binding electrode 302 in the binding area 300 are exposed on the surface of the silicon-based substrate 10. In some possible implementations, the pixel driving circuit may further include a sensing transistor and a second scanning line.

In an exemplary embodiment, a material of the silicon-based substrate may include any one or more of silicon, germanium and compound semiconductors. The compound semiconductors may include any one or more of silicon germanium, silicon carbide, gallium arsenide, gallium phosphide, indium phosphide, indium arsenide and indium antimonide. The silicon-based substrate may be doped or undoped.

Figure 11:
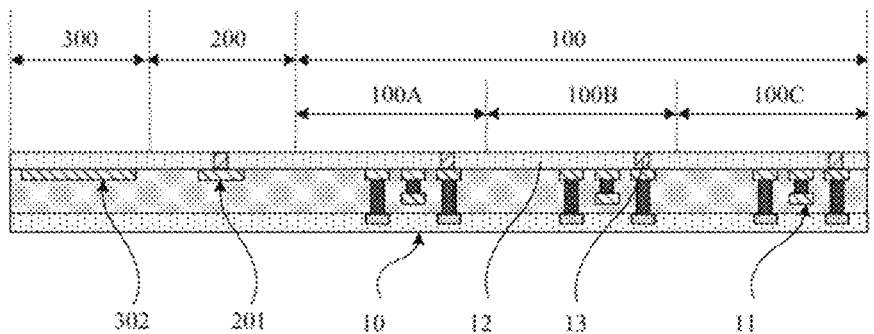
FIG. 11 is a schematic diagram of a display substrate after a first insulating layer and a first conductive pillar are formed according to the present disclosure.

(2) A first insulating thin film is deposited on the silicon-based substrate 10. The first insulating thin film is patterned by a patterning process to form a pattern of a first insulating layer 12 covering the entire silicon-based substrate 10. A plurality of first via holes are formed in the first insulating layer 12 in the display area 100 and the peripheral area 200. The plurality of first via holes respectively expose the drain electrode of the driving transistor 11 in the display area 100 and the power supply electrode 201 in the peripheral area 200. Then, a plurality of first conductive pillars 13 are formed in the first via holes on the first insulating layer 12. The first conductive pillars 13 in the display area 100 are connected with the drain electrodes of the driving transistors 11 of the display units where the first conductive pillars 13 are located, and the first conductive pillars 13 in the peripheral area 200 are connected with the power supply electrodes 201, as shown in FIG. 11. In an exemplary embodiment, the first conductive pillar 13 may be made of a metal material. After the first conductive pillar 13 is formed by a filling treatment, the surfaces of the first insulating layer 12 and the first conductive pillar 13 are eroded and etched by a chemical mechanical polishing (CMP) process to remove part of the thickness of the first insulating layer 12 and the first conductive pillar 13 so that the first insulating layer 12 and the first conductive pillar 13 have flush surfaces. In some possible implementations, tungsten (W) may be used for the first conductive pillar 13, and the via hole filled with tungsten is called W-via hole. When the thickness of the first insulating layer 12 is relatively large, the use of W-via holes may ensure stability of the conductive path. Due to the mature process for fabricating W-via holes, the resultant first insulating layer 12 has good surface flatness, which is beneficial to reducing contact resistance. In the present disclosure, W-via holes are not only suitable for connection between the silicon-based substrate 10 and the reflective layer, but also suitable for connection between the reflective layer and the anode layer, and connection between other wiring layers. After this process, the silicon-based substrate 10 in the binding area is covered with the first insulating layer 12.

Figure 12:
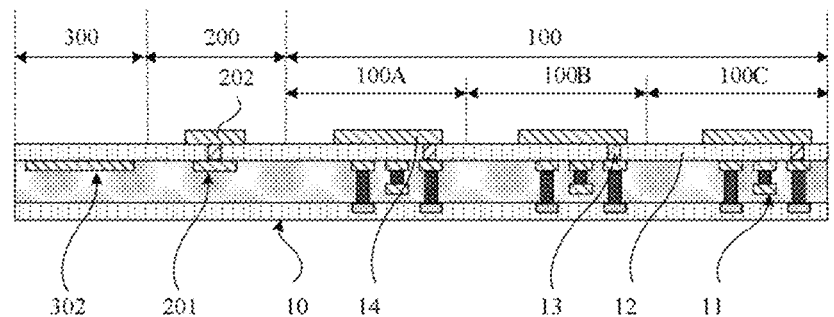
FIG. 12 is a schematic diagram of a display substrate after a reflective electrode is formed according to the present disclosure.

(3) A first metal thin film is deposited on the silicon-based substrate 10 on which the above structure is formed, and the first metal thin film is patterned by a patterning process to form patterns of a reflective electrode 14 and a first connection electrode 202 on the first insulating layer 12. The reflective electrode 14 is formed in each display unit in the display area 100, the reflective electrode 14 is connected with the drain electrode of the driving transistor 11 through the first conductive pillar 13; and the first connection electrode 202 is formed in the peripheral area 200, and the first connection electrode 202 is connected to the power supply electrode 201 through the first conductive pillar 13, as shown in FIG. 12. In an exemplary embodiment, the reflective electrode 14 of each display unit is configured to form a microcavity structure with a cathode formed later, to cause, by utilizing the strong reflection effect of the reflective electrode, the light directly emitted by the organic light emitting layer and the light reflected by the reflective electrode to interfere with each other, thereby improving the color gamut of the emitted light and enhancing the brightness of the emitted light. In this patterning process, the film layer structure of the binding area 300 is not changed, including the silicon-based substrate 10 provided with the binding electrode 302, and the first insulating layer 12 covering the silicon-based substrate 10.

Figure 13:
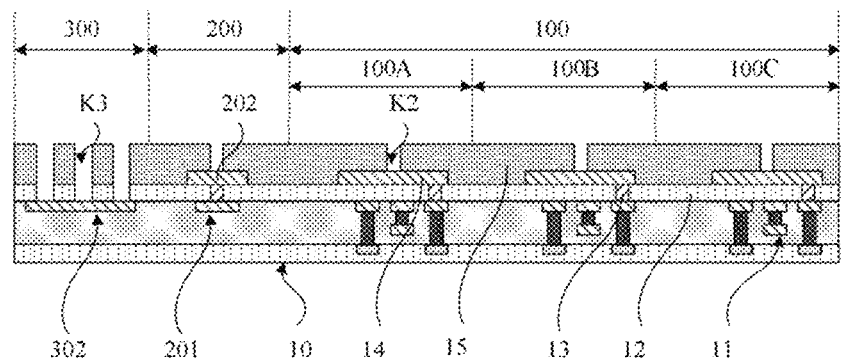
FIG. 13 is a schematic diagram of a display substrate after a second insulating layer is formed according to the present disclosure.

(4) A second insulating thin film is deposited on the silicon-based substrate 10 on which the above structure is formed, and the second insulating thin film is patterned by a patterning process to form a pattern of a second insulating layer 15 covering the entire silicon-based substrate 10. A plurality of second via holes K2 are formed in the second insulating layer 15 in the display area 100 and the peripheral area 200, and a plurality of third via holes K3 are formed in the second insulating layer 15 in the binding area 300. The second insulating layer 15 in the plurality of second via holes K2 in the display area 100 is etched away to expose the reflective electrode 14 of each display unit, and the second insulating layer 15 in the second via holes K2 in the peripheral area 200 is etched away to expose the first connection electrode 202. The first insulating layer 12 and the second insulating layer 15 in the third via holes K3 in the binding area 300 are etched away to expose the binding electrodes 302 of the silicon-based substrate 10, as shown in FIG. 13.

Figure 14:
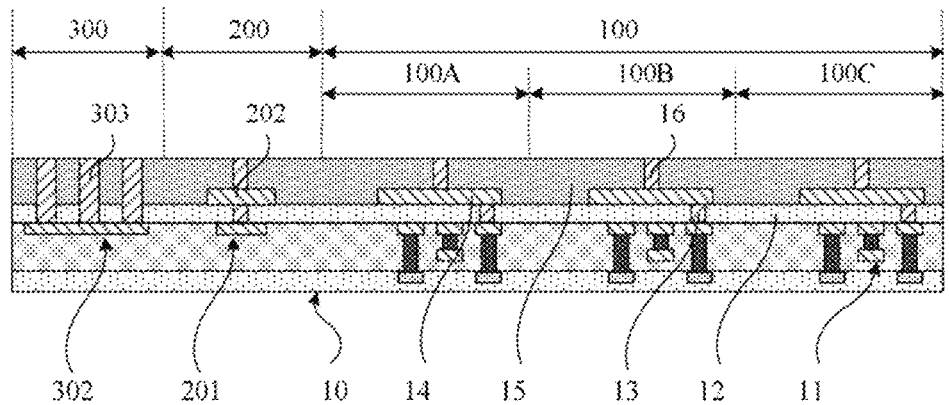
FIG. 14 is a schematic diagram of a display substrate after second and third conductive pillars are formed according to the present disclosure.

(5) A pattern of a conductive pillar is formed in the via hole of the second insulating layer 15. The second conductive pillars 16 formed in the plurality of second via holes K2 in the display area 100 are connected with the reflective electrodes 14 of the display units where the second conductive pillars 16 are located, the second conductive pillars 16 formed in the second via holes K2 in the peripheral area 200 are connected with the first connection electrodes 202, and the third conductive pillars 303 formed in the third via holes K3 in the binding area 300 are connected with the binding electrodes 302, as shown in FIG. 14. In an exemplary embodiment, the second conductive pillars 16 and the third conductive pillars 303 may be made of metal materials. After the second conductive pillars 16 and the third conductive pillars 303 are respectively formed by a filling treatment, the surfaces of the second insulating layer 15, the second conductive pillars 16 and the third conductive pillars 303 are eroded and etched by a chemical mechanical polishing process to remove part of the thicknesses of the second insulating layer 15, the second conductive pillars 16 and the third conductive pillars 303, so that the second insulating layer 15, the second conductive pillars 16 and the third conductive pillars 303 have flat surfaces. In some possible implementations, tungsten (W) may be used for the second conductive pillars 16 and the third conductive pillars 303. After this patterning process, the binding area 300 includes the silicon-based substrate 10 provided with the binding electrodes 302, and the first insulating layer 12 and the second insulating layer 15 stacked on the silicon-based substrate 10, the first insulating layer 12 and the second insulating layer 15 being provided with third via holes K3 in which the third conductive pillars 303 are disposed.

Figure 15:
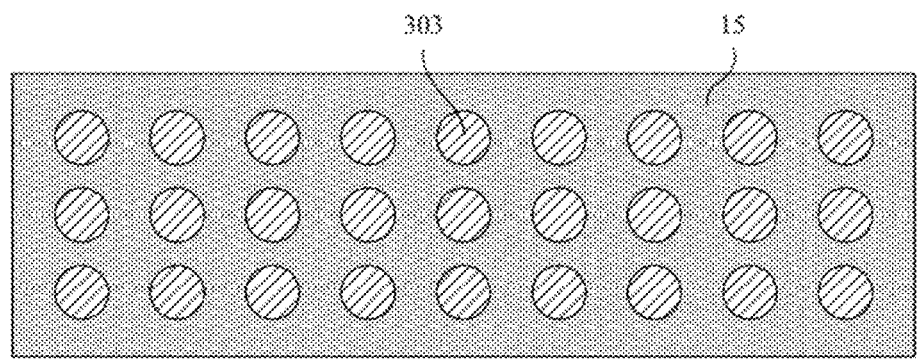
FIG. 15 is a schematic plan view of a display substrate after a third conductive pillar is formed in a binding area according to the present disclosure.

FIG. 15 is a schematic plan view of a display substrate after third conductive pillars are formed in a binding area according to the present disclosure. As shown in FIG. 15, after the process of forming conductive pillars, a plurality of third conductive pillars 303 arranged in an array are presented on the flat second insulating layer 15 in the binding area 300. One column of third conductive pillars 303 correspond to one binding electrode of the silicon-based substrate 10, and multiple columns of third conductive pillars 303 arranged at intervals form a conductive pillar array which serves as an interface for binding of the display substrate to a flexible printed circuit.

Figure 16:
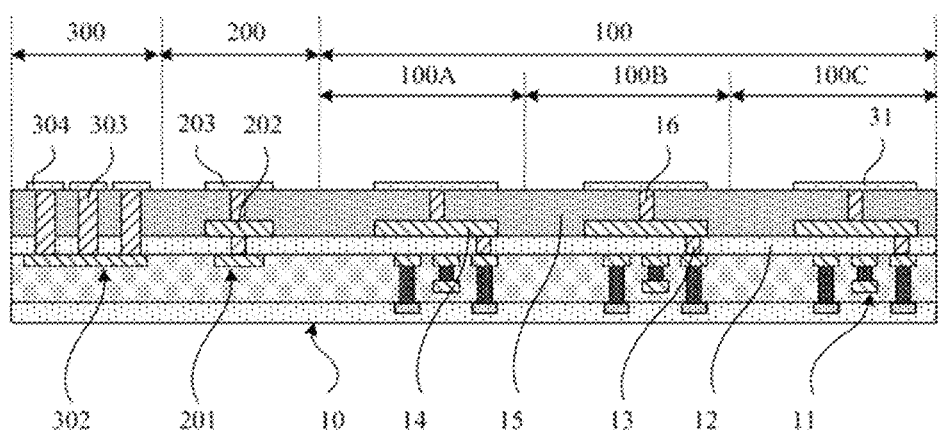
FIG. 16 is a schematic diagram of a display substrate after an anode and a binding platform are formed according to the present disclosure.

(6) A transparent conductive thin film is deposited on the silicon-based substrate 10 on which the aforementioned structure is formed, and the transparent conductive thin film is patterned by a patterning process to form an anode 31, a second connection electrode 203 and a binding platform 304 on the second insulating layer 15. The anode 31 is formed in each display unit in the display area 100, and is connected with the reflective electrode 14 through the second conductive pillar 16 of the display unit in which the anode 31 is located. The second connection electrode 203 is formed in the peripheral area 200, and the second connection electrode 203 is connected with the first connection electrode 202 through the second conductive pillar 16 of the peripheral area 200. The binding platform 304 is formed in the binding area 300, and the binding platform 304 is connected with the binding electrode 302 through a plurality of third conductive pillars 303, as shown in FIG. 16. The anode 31 is connected with the reflective electrode 14 through the second conductive pillar 16, while the reflective electrode 14 is connected with the drain electrode of the driving transistor 11 through the first conductive pillar 13. In this way, an electrical signal provided by the pixel driving circuit is transmitted to the anode 31 through the reflective electrode 14. The reflective electrode 14 forms a conductive channel between the pixel driving circuit and the anode, and also forms a microcavity structure with the cathode formed later, which is not only beneficial to control of the light emitting devices by the pixel driving circuit, but also makes the structure of the display substrate more compact, which is conducive to the miniaturization of a silicon-based OLED display apparatus. After this patterning process, the binding area 300 includes the silicon-based substrate 10 provided with the binding electrodes 302, the first insulating layer 12 and the second insulating layer 15 stacked on the silicon-based substrate 10, and the binding platforms 304 arranged on the second insulating layer 15, the binding platforms 304 being connected with the binding electrodes 302 through a plurality of third conductive pillars 303.

Figure 17:
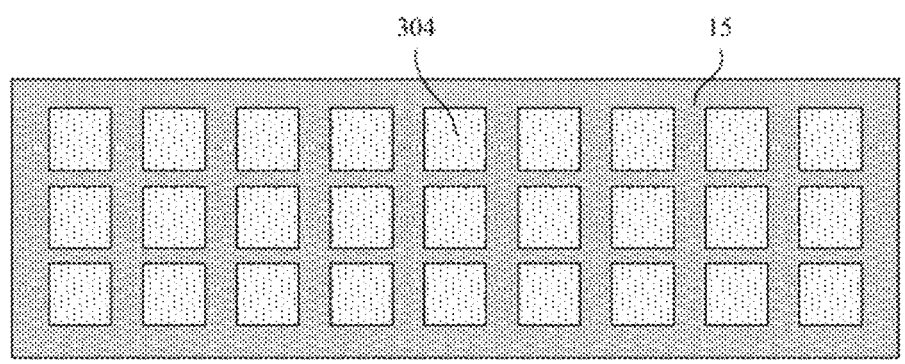
FIGS. 17 and 18 are schematic plan views of a display substrate after a binding platform is formed in a binding area according to the present disclosure.
Figure 18:
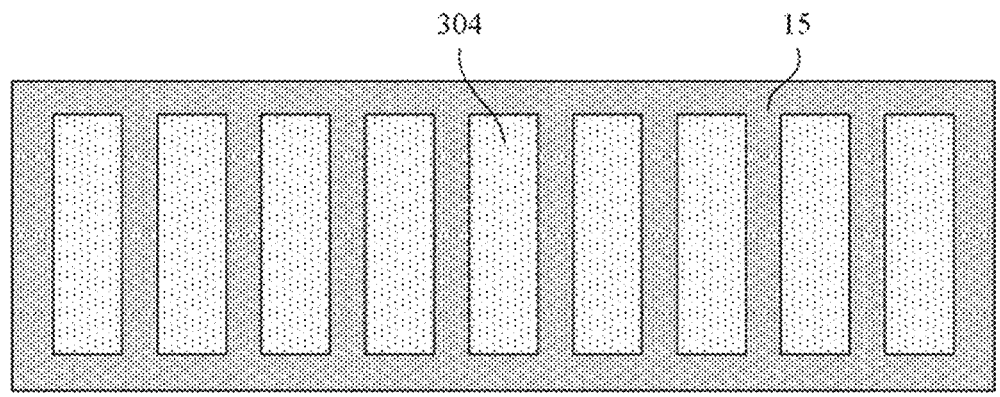

FIG. 17 is a schematic plan view of a display substrate after binding platforms are formed in the binding area according to the present disclosure. As shown in FIG. 17, in an exemplary embodiment, the binding platform 304 includes a plurality of overlap electrodes. After the process of forming the binding platform, a plurality of overlap electrodes arranged in an array are presented on the flat second insulating layer 15 in the binding area 300. One column of overlap electrodes correspond to one strip-shaped binding electrode 302 of the silicon-based substrate 10, and are connected with the binding electrode 302 through third conductive pillars 303 in a plurality of third via holes. Multiple columns of overlap electrodes arranged at intervals form an overlapping electrode array which serves as an substrate for binding of the display substrate to a flexible printed circuit, so that the binding area 300 is flat and has no unevenness, thus increasing the press force of the gold fingers on the conductive gold balls, increasing the adhesive force between the flexible printed circuit and the binding platform, and improving the working reliability of the flexible printed circuit bound to the display substrate. In some possible implementations, the binding platform may include a plurality of strip-shaped overlap electrodes which are arranged at intervals. One strip-shaped overlap electrode corresponds to one strip-shaped binding electrode of the silicon-based overlay substrate, and one strip-shaped overlap electrode is connected with one strip-shaped binding electrode through the third conductive pillars in a plurality of third via holes, as shown in FIG. 18. In some possible implementations, in a plane parallel to the display substrate, a shape of a section of the third conductive pillar may be circular, elliptical, rectangular or polygonal, and a shape of a section of the overlap electrode may be circular, elliptical, rectangular or polygonal.

Figure 19:
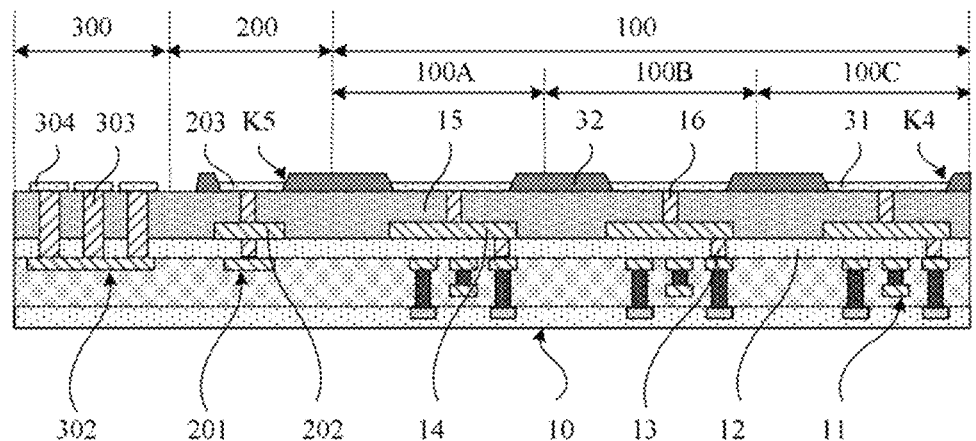
FIG. 19 is a schematic diagram of a display substrate after a pixel definition layer is formed according to the present disclosure.

(7) A pixel definition thin film is coated onto the silicon-based substrate 10 on which the above structure is formed, and a pattern of a pixel definition layer (PDL) 32 is formed by mask, exposure and development process. The pixel definition layer 32 is formed in the display area 100 and the peripheral area 200. The pixel definition layer 32 in the display area 100 is provided with a pixel opening K4 exposing the anode 31 of each display unit. The pixel definition layer 32 in the peripheral area 200 is provided with a cathode via hole K5 exposing the second connection electrode 203, as shown in FIG. 19. After this patterning process, the film layer structure of the binding area 300 is not changed.

Figure 20:
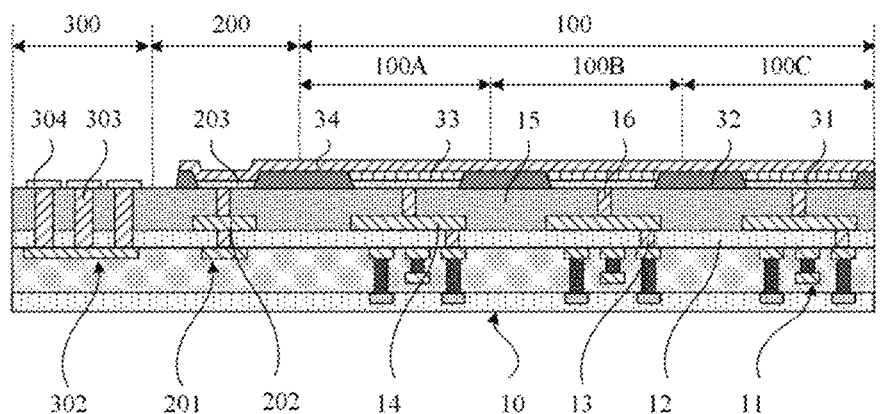
FIG. 20 is a schematic diagram of a display substrate after an organic light emitting layer and a cathode are formed according to the present disclosure.

(8) An organic light emitting layer 33 and a cathode 34 are sequentially formed on the silicon-based substrate 10 on which the aforementioned structure is formed. The organic light emitting layer 33 is formed in each display unit of the display area 100, and is connected to the anode 31 of the display unit, in which the organic light emitting layer 33 is located, through the pixel opening K4. A planar cathode 34 is formed in the display area 100 and the peripheral area 200. The cathode 34 in the display area 100 is connected with the organic light emitting layer 33 of each display unit, and the cathode 34 in the peripheral area 200 is connected with the second connection electrode 203 through the cathode via hole K5, as shown in FIG. 20. The first connection electrode 202 is connected with the power supply electrode 201 through the first conductive pillar 13, the second connection electrode 203 is connected with the first connection electrode 202 through the second conductive pillar 16, and the cathode 34 is connected with the second connection electrode 203 through the cathode via hole K5. In this way, the first connection electrode 202 and the second connection electrode 203 form a conductive channel between the cathode and the power supply electrode 201, and a voltage signal provided by the power supply electrode 201 is transmitted to the cathode 34 through the conductive channel, thus achieving a cathode ring structure. In order to ensure etching uniformity, the pattern design of the cathode ring in peripheral area 200 is consistent with the pattern design of the display area 100. In an exemplary embodiment, the cathode 34 is a transflective electrode, and constitutes a microcavity structure with the previously formed reflective electrode 14. After this patterning process, the film layer structure of the binding area 300 is not changed.

Figure 21:
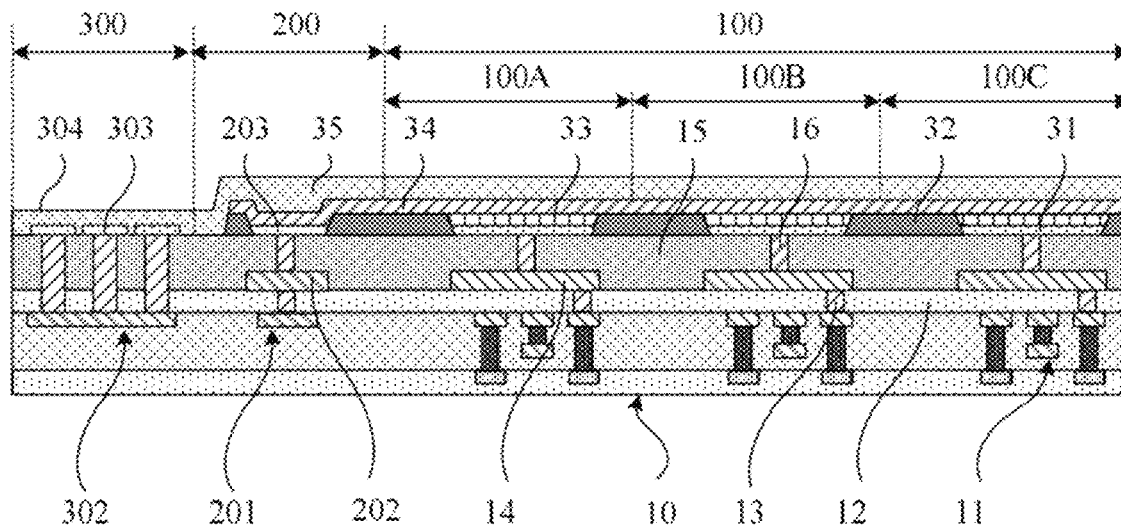
FIG. 21 is a schematic diagram of a display substrate after an encapsulation layer is formed according to the present disclosure.

(9) A pattern of an encapsulation layer 35 is formed on the silicon-based substrate 10 on which the aforementioned structure is formed. The encapsulation layer is formed in the display area 100, the peripheral area 200 and the binding area 300, as shown in FIG. 21. In an exemplary embodiment, the encapsulation layer 35 may include a plurality of film layers, such as a first sub-encapsulation layer of inorganic material and a second sub-encapsulation layer of organic material, or a first sub-encapsulation layer of inorganic material, a second sub-encapsulation layer of organic material and a third sub-encapsulation layer of inorganic material, which are prepared by chemical vapor deposition (CVD), plasma enhanced chemical vapor deposition (PECVD), atomic layer deposition (ALD) or molecular layer deposition (MLD) equipment. After this patterning process, the binding area 300 includes the silicon-based substrate 10 provided with binding electrodes 302, the first insulating layer 12 and the second insulating layer 15 stacked on the silicon-based substrate 10, the binding platform 304 disposed on the second insulating layer 15, and the encapsulation layer 35 covering the binding platform 304.

Figure 22:
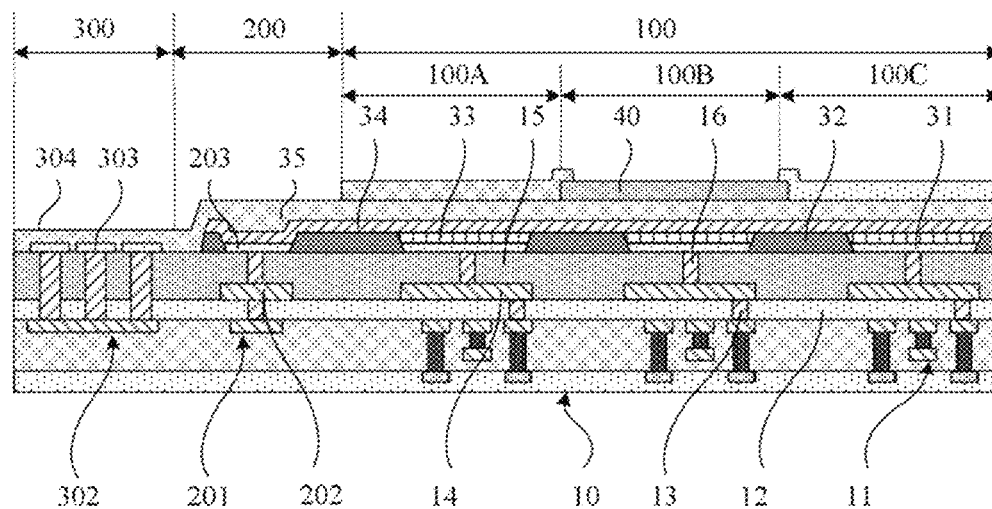
FIG. 22 is a schematic diagram of a display substrate after a color filter layer is formed according to the present disclosure.

(10) A pattern of a color filter layer 40 is formed on the silicon-based substrate 10 on which the aforementioned structure is formed. The color filter layer 40 is formed in the display area 100. The color filter layer 40 in the display area 100 includes a first color unit, a second color unit and a third color unit corresponding to the display units, as shown in FIG. 22. In an exemplary embodiment, the color units in the color filter layer 40 may overlap each other as a black matrix, or a black matrix may be provided between the color cells. In an exemplary embodiment, the first color unit may be a green unit, the second color unit may be a red unit, and the third color unit may be a blue unit. In some possible implementations, the preparation process of the color filter layer 40 includes: forming blue units, then red units, and finally green units. In some possible implementations, the color filter layer 40 may include other color units, such as white units or yellow units. In this patterning process, the film layer structures of the binding area 300 and the peripheral area 200 are not changed.

In a subsequent process, a cover plate 50 is formed by a sealing process. The cover plate 50 is arranged in the display area 100 and the peripheral area 200, and is fixed by a sealant. The silicon-based substrate 10, the cover plate 50 and the sealant collectively form a closed space, which additionally provides protection against water and oxygen, and greatly prolongs the service life of the silicon-based OLED display substrate. Then, an opening process is adopted to remove the encapsulation layer 35 from the binding area 300, so that the binding platform 304 in the binding area 300 is exposed. Subsequently, the formed display motherboard is cut to form an individual display substrate, as shown in FIG. 9.

Figure 23:
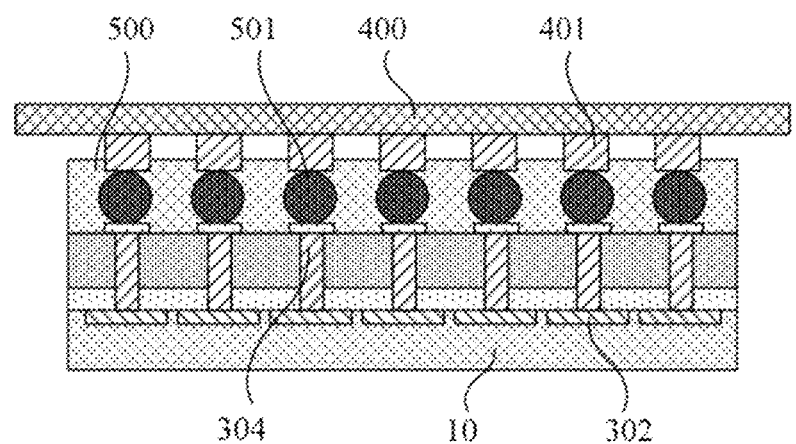
FIGS. 23 and 24 are schematic sectional views of a display substrate in a binding process according to the present disclosure.
Figure 24:
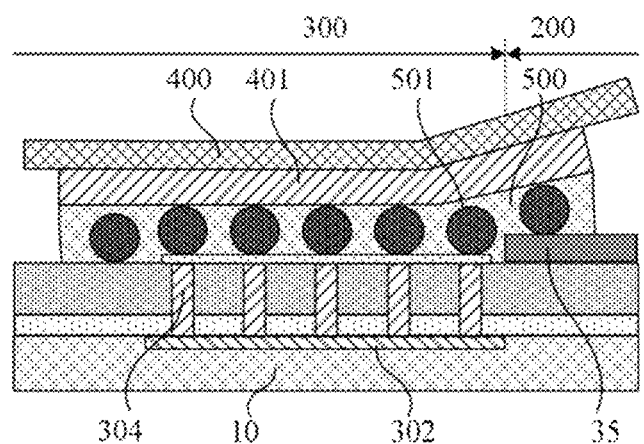

FIGS. 23 and 24 are schematic sectional views of a display substrate in a binding process according to the present disclosure. FIG. 23 is a sectional view taken in the A-A direction in FIG. 1, and FIG. 24 is a sectional view taken in the B-B direction in FIG. 1. As shown in FIG. 23, on the section taken in the A-A direction, the conductive gold balls 501 are located between the gold finger 401 and the binding platform 304, the gold finger 401 presses the conductive gold balls 501 well and can crush the conductive gold balls 501 to ensure electrical connection between the gold finger 401 and the binding electrode 302. As shown in FIG. 24, on the section taken in the B-B direction, although the peripheral area 200 is provided with the encapsulation layer 35 and the encapsulation layer 35 in the binding area 300 is removed, since the binding platform 304 is disposed in the binding area 300 of the display substrate of the present disclosure, the height difference between the film layer of the binding area 300 and the film layer of the peripheral area 200 is reduced, and the distance between a surface of one side of the binding platform 304 away from the silicon-based substrate 10 and a surface of one side of the encapsulation layer 35 away from the silicon-based substrate 10 is smaller than the thickness of the encapsulation layer 35. In addition, by arranging the binding platform 304, the film layer structure on the surface of the binding area 300 is a flat structure, which avoids a zigzag structure of the binding area 300. In this way, for the conductive gold balls 501 located on the binding platform 304, whether they are located at an edge of a side of the binding platform 304 adjacent to the peripheral area 200 or located at an edge of a side of the binding platform 304 away from the peripheral area 200, the gold fingers 401 press the conductive gold balls 501 well and can crush the conductive gold balls 501, thus ensuring electrical connection between the gold fingers 401 and the binding electrodes 302, which improves reliability of the electrical connection. In addition, since the gold fingers 401 of the flexible printed circuit 400 can press the conductive gold balls 501 well, the adhesive force between the flexible printed circuit 400 and the display substrate is improved, which avoids the case where the flexible printed circuit 400 falls off during use, reduces the risk of product failure, and improves the working reliability of the product.

In the aforementioned preparation process, the first insulating thin film and the second insulating thin film may be made of any one or more of silicon oxide (SiOx), silicon nitride (SiNx), silicon oxynitride (SiON) and a compound semiconductor, which many be a single-layer structure or a multi-layer composite structure. The first metal thin film may be made of metal materials, including any one or more of argentum (Ag), copper (Cu), aluminum (Al) and molybdenum (Mo), or alloy materials composed of metals, such as aluminum neodymium alloy (AlNd) or molybdenum niobium alloy (MoNb), or may be a multi-layer composite structure, such as a Mo/Cu/Mo composite structure. The transparent conductive thin film may be made of indium tin oxide (ITO) or indium zinc oxide (IZO), or may be a composite structure of metal and transparent conductive thin film, such as ITO/Ag/ITO. The pixel definition layer may be made of polyimide, acrylic or polyethylene terephthalate or the like.

Figure 25:
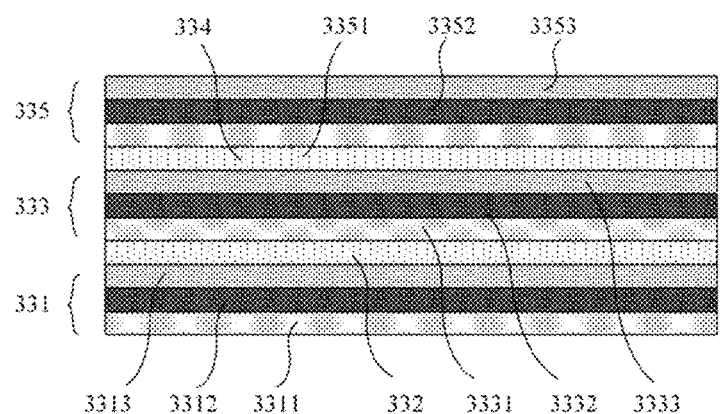
FIG. 25 is a schematic diagram of a structure of an organic light emitting layer according to the present disclosure.

FIG. 25 is a schematic diagram of a structure of an organic light emitting layer according to the present disclosure. As shown in FIG. 25, the structure of the organic light emitting layer of the present disclosure includes a first light emitting sublayer 331, a first charge generating layer 332, a second light emitting sublayer 333, a second charge generating layer 334 and a third light emitting sublayer 335 that are sequentially stacked between an anode and a cathode. The first light emitting sublayer 331 is configured to emit light of a first color, and includes a first hole transporting layer (HTL) 3311, a first emitting material layer (EML) 3312 and a first electron transporting layer (ETL) 3313 that are stacked in this order. The second light emitting sublayer 333 is configured to emit light of a second color, and includes a second hole transporting layer 3331, a second emitting material layer 3332 and a second electron transporting layer 3333 that are stacked in this order. The third light emitting sublayer 335 is configured to emit light of a third color, and includes a third hole transporting layer 3351, a third emitting material layer 3352 and a third electron transporting layer 3353 that are stacked in this order. The first charge generating layer 332 is disposed between the first light emitting sublayer 331 and the second light emitting sublayer 333, and is configured to connect the two light emitting sublayers in series to achieve carrier transfer. The second charge generating layer 334 is disposed between the second light emitting sublayer 333 and the third light emitting sublayer 335, and is configured to connect the two light emitting sublayers in series to achieve carrier transfer. Since in the present disclosure, the organic light emitting layer includes a first emitting material layer emitting light of a first color, a second emitting material layer emitting light of a second color, and a third emitting material layer emitting light of a third color, the light eventually emitted by the organic light emitting layer is mixed light. For example, it may be arranged that the first emitting material layer is a red light material layer emitting red light, the second emitting material layer is a green light material layer emitting green light, and the third emitting material layer is a blue light material layer emitting blue light; therefore, the organic light emitting layer eventually emits white light.

In an exemplary embodiment, the organic light emitting layer shown in FIG. 25 is merely an exemplary structure, which is not limited in the present disclosure. In practice, the structure of the organic light emitting layer may be designed according to actual needs. For example, in each light emitting sublayer, in order to improve the efficiency of injecting electrons and holes into the emitting material layers, a hole injection layer (HIL) and an electron injection layer (EIL) may be further provided. In another example, in order to simplify the structure of the organic light emitting layer, the first electron transporting layer, the first charge generating layer and the second hole transporting layer may be cancelled, that is, the second emitting material layer may be disposed directly on the first emitting material layer.

In some possible implementations, the organic light emitting layer may be an organic light emitting layer emitting light of the first color and an organic light emitting layer emitting complementary light of the light of the first color, and the two organic light emitting layers are sequentially stacked relative to the silicon-based substrate, thereby emitting white light as a whole, which is not limited in the present disclosure, as long as the emission of white light can be achieved.

As can be seen from the structure of the display substrate of the present disclosure and the preparation process thereof, by arranging in the binding area a binding platform which is arranged on the same layer as the anode of the light emitting element and serves as an substrate for binding of the display substrate to a flexible printed circuit, the height difference between the film layer of the binding area and the film layer of the peripheral area is reduced, and the film layer structure of the binding area is enabled to be a flat structure, so that in the binding process, the gold fingers of the flexible printed circuit well press the conductive gold balls in the anisotropic conductive film, which can ensure that the gold fingers crush the conductive gold balls, thereby achieving reliable electrical connection between the gold fingers and the binding platform, and improving the reliability of the electrical connection. In addition, since the gold fingers of the flexible printed circuit can press the conductive gold balls well, the adhesive force between the flexible printed circuit and the display substrate is improved, which avoids the case where the flexible printed circuit falls off during use, reduces the risk of product failure, and improves the working reliability of the product. The preparation process of the present disclosure can be achieved by using mature preparation equipment, and has small improvements in process, high compatibility, simple process flow, high production efficiency, low production cost and high yield, and therefore has a good application prospect.

The structure shown in the present disclosure and the preparation process thereof are merely an exemplary description. In an exemplary embodiment, corresponding structures may be changed and patterning processes may be added or reduced according to actual needs. For example, lengths of the microcavity structures of the display units may be the same or may be different. In another example, in the process of forming a reflective electrode in the display area, a corresponding bonding pad may be formed in the binding area, which is not specifically limited in the present disclosure.

The present disclosure provides a method for preparing a display substrate, the display substrate including a display area, a peripheral area and a binding area, the peripheral area being located at a periphery of the display area and the binding area being located on one side of the peripheral area away from the display area, the method including:

S1, forming an array structure layer on a silicon-based substrate; wherein a driving transistor and a first power line are arranged in the silicon-based substrate in the display area, and a first electrode of the driving transistor is connected with the first power line; a power supply electrode and a second power line are arranged in the silicon-based substrate in the peripheral area, and the power supply electrode is connected with the second power line; and a bonding pad assembly is arranged in the silicon-based substrate in the binding area, and the bonding pad assembly is connected with the first power line and the second power line;

S2, forming a light emitting element and a binding platform on the array structure layer, wherein the light emitting element is located in the display area, and an anode of the light emitting element is connected with a second electrode of the driving transistor; the binding platform is located in the binding area, and the binding platform is connected with the bonding pad assembly through a conductive pillar; and the binding platform and the anode of the light emitting element are arranged on the same layer, and the binding platform is configured to be bound to a flexible printed circuit.

In an exemplary embodiment, step S1 may include:
forming a first insulating layer on the silicon-based substrate, the first insulating layer in the display area and the peripheral area being formed with first via holes;
forming first conductive pillars in the first via holes;
forming a reflective electrode and a first connection electrode, the reflective electrode in the display area being connected with the second electrode of the driving transistor through the first conductive pillar, and the first connection electrode in the peripheral area being connected with the power supply electrode through the first conductive pillar;
forming a second insulating layer covering the reflective electrode and the first connection electrode, the second insulating layer in the display area and the peripheral area being formed with second via holes, and the second insulating layer in the binding area being formed with third via holes;
forming second conductive pillars and third conductive pillars in the second via holes and the third via holes, respectively, the second conductive pillars in the display area being connected with the reflective electrode, the second conductive pillars in the peripheral area being connected with the first connection electrode, and the third conductive pillars in the binding area being connected with the bonding pad assembly.

In an exemplary embodiment, step S2 may include:
forming an anode on the second insulating layer in the display area, a second connection electrode on the second insulating layer in the peripheral area, and a binding platform on the second insulating layer in the binding area through one patterning process, wherein the anode is connected with the reflective electrode through the second conductive pillar, the second connection electrode is connected with the first connection electrode through the second conductive pillar, and the binding platform is connected with the bonding pad assembly through the third conductive pillar;
forming a pixel definition layer in the display area and the peripheral area, wherein the pixel definition layer in the display area is provided with a pixel opening exposing the anode, and the pixel definition layer in the peripheral area is provided with a cathode via hole exposing the second connection electrode;
forming an organic light emitting layer in the display area, wherein the organic light emitting layer is connected with the anode through the pixel opening;
forming a cathode in the display area and the peripheral area, wherein the cathode in the display area is connected with the organic light emitting layer, and the cathode in the peripheral area is connected with the second connection electrode through the cathode via hole.

In an exemplary embodiment, the bonding pad assembly may include a plurality of strip-shaped binding electrodes arranged at intervals, the binding platform includes a plurality of overlap electrodes arranged in an array, and a plurality of overlap electrodes are connected with one strip-shaped binding electrode through a plurality of third conductive pillars.

In an exemplary embodiment, the bonding pad assembly may include a plurality of strip-shaped binding electrodes arranged at intervals, the binding platform includes a plurality of strip-shaped overlap electrodes arranged at intervals, and one overlapping electrode is connected with one strip-shaped binding electrode through a plurality of third conductive pillars.

In an exemplary embodiment, materials of the first conductive pillar, the second conductive pillar and the third conductive pillar include tungsten.

The present disclosure further provides a display apparatus, including the aforementioned display substrate. The display apparatus may be a virtual reality apparatus, an augmented reality apparatus or a near-eye display apparatus, or may be a mobile phone, a tablet computer, a television, a display, a notebook computer, a digital photo frame or a navigator, or any other product or component with a display function.

Although the embodiments disclosed in the present disclosure are as described above, the described contents are only the embodiments for facilitating understanding of the present disclosure, which are not intended to limit the present disclosure. A person skilled in the art to which the present disclosure pertains may make any modifications and variations in the form and details of implementation without departing from the spirit and scope of the present disclosure. Nevertheless, the scope of patent protection of the present application shall still be determined by the scope defined by the appended claims.

What we claim is:

1. A display substrate, comprising:
a display area, a peripheral area and a binding area, the peripheral area being located at a periphery of the display area, the binding area being located on one side of the peripheral area away from the display area; the display substrate comprising a silicon-based substrate and an array structure layer arranged on the silicon-based substrate; a driving transistor and a first power line being arranged in the silicon-based substrate in the display area, a light emitting element being disposed on the array structure layer in the display area, a first electrode of the driving transistor being connected with the first power line, and a second electrode of the driving transistor being connected with an anode of the light emitting element; a power supply electrode and a second power line being arranged in the silicon-based substrate in the peripheral area, the power supply electrode being connected with the second power line; and a bonding pad assembly being disposed in the silicon-based substrate in the binding area, a binding platform being arranged on the array structure layer in the binding area, the binding platform being connected with the bonding pad assembly by a conductive pillar, the bonding pad assembly being connected with the first power line and the second power line, the binding platform and the anode of the light emitting element being arranged on the same layer, and the binding platform being configured to be bound to a flexible printed circuit.

2. The display substrate according to claim 1, wherein the array structure layer in the display area comprises a first insulating layer arranged on the silicon-based substrate, a reflective electrode arranged on the first insulating layer and a second insulating layer covering the reflective electrode, the first insulating layer is provided with a first via hole in which a first conductive pillar is arranged, the reflective electrode is connected with the second electrode of the driving transistor by the first conductive pillar, and the second insulating layer is provided with a second via hole in which a second conductive pillar connected with the reflective electrode is arranged.

3. The display substrate according to claim 2, wherein the light emitting element in the display area comprises an anode arranged on the second insulating layer, an organic light emitting layer connected with the anode and a cathode connected with the organic light emitting layer, and the anode is connected with the reflective electrode by the second conductive pillar.

4. The display substrate according to claim 1, wherein the array structure layer in the binding area comprises a first insulating layer and a second insulating layer stacked on the silicon-based substrate, the first insulating layer and the second insulating layer are provided with a third via hole in which a third conductive pillar is arranged, and the binding platform is arranged on the second insulating layer and is connected with the bonding pad assembly by the third conductive pillar.

5. The display substrate according to claim 4, wherein the bonding pad assembly comprises a plurality of strip-shaped binding electrodes arranged at intervals, the binding platform comprises a plurality of overlap electrodes arranged in an array, and a plurality of the overlap electrodes are connected with one strip-shaped binding electrode by a plurality of third conductive pillars.

6. The display substrate according to claim 4, wherein the bonding pad assembly comprises a plurality of strip-shaped binding electrodes arranged at intervals, the binding platform comprises a plurality of strip-shaped overlap electrodes arranged at intervals, and one overlap electrode is connected with one strip-shaped binding electrode by a plurality of third conductive pillars.

7. The display substrate according to claim 4, wherein materials of the first conductive pillar, the second conductive pillar and the third conductive pillar comprise tungsten.

8. The display substrate according to claim 1, wherein the array structure layer in the peripheral area is provided with a second connection electrode and a cathode of the light emitting element, the cathode of the light emitting element is connected with the second connection electrode, and the second connection electrode is connected with the power supply electrode.

9. The display substrate according to claim 8, wherein the array structure layer in the peripheral area comprises a first insulating layer arranged on the silicon-based substrate, a first connection electrode arranged on the first insulating layer and a second insulating layer covering the first connection electrode, the first insulating layer is provided with a first via hole in which a first conductive pillar is arranged, the first connection electrode is connected with the power supply electrode by the first conductive pillar, and the second insulating layer is provided with a second via hole in which a second conductive pillar is arranged, and the second connection electrode is connected with the first connection electrode by the second conductive pillar.

10. A display apparatus, comprising the display substrate according to claim 1.

11. A method for preparing a display substrate, the display substrate comprising a display area, a peripheral area and a binding area, the peripheral area being located at a periphery of the display area and the binding area being located on one side of the peripheral area away from the display area; the method comprising:
forming an array structure layer on a silicon-based substrate; a driving transistor and a first power line being arranged in the silicon-based substrate in the display area, and a first electrode of the driving transistor being connected with the first power line; a power supply electrode and a second power line being arranged in the silicon-based substrate in the peripheral area, and the power supply electrode being connected with the second power line; and a bonding pad assembly being arranged in the silicon-based substrate in the binding area, and the bonding pad assembly being connected with the first power line and the second power line; and
forming a light emitting element and a binding platform on the array structure layer; the light emitting element being located in the display area, and an anode of the light emitting element being connected with a second electrode of the driving transistor; the binding platform being located in the binding area, and the binding platform being connected with the bonding pad assembly by a conductive pillar; and the binding platform and the anode of the light emitting element being arranged on the same layer, and the binding platform being configured to be bound to a flexible printed circuit.

12. The method according to claim 11, wherein the forming the array structure layer on the silicon-based substrate comprises:

forming a first insulating layer on the silicon-based substrate; the first insulating layer in the display area and the peripheral area being formed with a first via hole;

forming a first conductive pillar in the first via hole;

forming a reflective electrode and a first connection electrode; the reflective electrode in the display area being connected with the second electrode of the driving transistor by the first conductive pillar, and the first connection electrode in the peripheral area being connected with the power supply electrode by the first conductive pillar;

forming a second insulating layer covering the reflective electrode and the first connection electrode; the second insulating layer in the display area and the peripheral area being formed with a second via hole, and the second insulating layer in the binding area being formed with a third via hole; and forming a second conductive pillar and a third conductive pillar in the second via hole and the third via hole, respectively; the second conductive pillar in the display area being connected with the reflective electrode, the second conductive pillar in the peripheral area being connected with the first connection electrode, and the third conductive pillar in the binding area being connected with the bonding pad assembly.

13. The method according to claim 12, wherein the forming the light emitting element and the binding platform on the array structure layer comprises:

forming an anode on the second insulating layer in the display area, a second connection electrode on the second insulating layer in the peripheral area, and a binding platform on the second insulating layer in the binding area by one patterning process; the anode being connected with the reflective electrode by the second conductive pillar, the second connection electrode being connected with the first connection electrode by the second conductive pillar, and the binding platform being connected with the bonding pad assembly by the third conductive pillar;

forming a pixel definition layer in the display area and the peripheral area; the pixel definition layer in the display area being provided with a pixel opening exposing the anode, and the pixel definition layer in the peripheral area being provided with a cathode via hole exposing the second connection electrode;

forming an organic light emitting layer in the display area; the organic light emitting layer being connected with the anode through the pixel opening; and forming a cathode in the display area and the peripheral area; the cathode in the display area being connected with the organic light emitting layer, and the cathode in the peripheral area being connected with the second connection electrode through the cathode via hole.

14. The method according to claim 12, wherein the bonding pad assembly comprises a plurality of strip-shaped binding electrodes arranged at intervals, the binding platform comprises a plurality of overlap electrodes arranged in an array, and a plurality of the overlap electrodes are connected with one strip-shaped binding electrode by a plurality of the third conductive pillars.

15. The method according to claim 12, wherein the bonding pad assembly comprises a plurality of strip-shaped binding electrodes arranged at intervals, the binding platform comprises a plurality of strip-shaped overlap electrodes arranged at intervals, and one overlap electrode is connected with one strip-shaped binding electrode by a plurality of the third conductive pillars.

16. The method according to claim 12, wherein materials of the first conductive pillar, the second conductive pillar and the third conductive pillar comprise tungsten.

17. The method according to claim 13, wherein the bonding pad assembly comprises a plurality of strip-shaped binding electrodes arranged at intervals, the binding platform comprises a plurality of overlap electrodes arranged in an array, and a plurality of the overlap electrodes are connected with one strip-shaped binding electrode by a plurality of the third conductive pillars.

18. The method according to claim 13, wherein the bonding pad assembly comprises a plurality of strip-shaped binding electrodes arranged at intervals, the binding platform comprises a plurality of strip-shaped overlap electrodes arranged at intervals, and one overlap electrode is connected with one strip-shaped binding electrode by a plurality of the third conductive pillars.

\* \* \* \* \*